US009842650B2

(12) United States Patent
Taniguchi et al.

(10) Patent No.: US 9,842,650 B2
(45) Date of Patent: Dec. 12, 2017

(54) NON-VOLATILE SRAM MEMORY CELL, AND NON-VOLATILE SEMICONDUCTOR STORAGE DEVICE

(71) Applicant: Floadia Corporation, Kodaira-shi, Tokyo (JP)

(72) Inventors: Yasuhiro Taniguchi, Kodaira (JP); Yutaka Shinagawa, Kodaira (JP); Hideo Kasai, Kodaira (JP); Ryotaro Sakurai, Kodaira (JP); Tatsuro Toya, Kodaira (JP); Yasuhiko Kawashima, Kodaira (JP); Kosuke Okuyama, Kodaira (JP)

(73) Assignee: FLOADIA CORPORATION, Kodaira-Shi, Tokyo (JP)

( * ) Notice: Subject to any disclaimer, the term of this patent is extended or adjusted under 35 U.S.C. 154(b) by 0 days.

(21) Appl. No.: 15/329,312

(22) PCT Filed: Jul. 22, 2015

(86) PCT No.: PCT/JP2015/070806
§ 371 (c)(1),
(2) Date: Jan. 26, 2017

(87) PCT Pub. No.: WO2016/017496
PCT Pub. Date: Feb. 4, 2016

(65) Prior Publication Data
US 2017/0221563 A1     Aug. 3, 2017

(30) Foreign Application Priority Data
Jul. 31, 2014 (JP) .................. 2014-157136

(51) Int. Cl.
G11C 14/00  (2006.01)
G11C 11/419 (2006.01)
G11C 13/00  (2006.01)

(52) U.S. Cl.
CPC ......... *G11C 14/009* (2013.01); *G11C 11/419* (2013.01); *G11C 13/0069* (2013.01)

(58) Field of Classification Search
CPC ... G11C 14/0063; G11C 14/00; G11C 11/412; G11C 14/0081; G11C 15/046;
(Continued)

(56) References Cited

U.S. PATENT DOCUMENTS

2014/0085978 A1* 3/2014 Lee .................. G11C 14/0063
                                                  365/185.08
2015/0262666 A1* 9/2015 Taniguchi ........... H01L 29/7881
                                                  365/185.08

FOREIGN PATENT DOCUMENTS

JP     S62-298998 A    12/1987
JP     2013-030240 A    2/2013
(Continued)

OTHER PUBLICATIONS

English translation of International Search Report from Corresponding Application No. PCT/JP2015/067412; dated Sep. 9, 2015.
(Continued)

*Primary Examiner* — Thong Q Le
(74) *Attorney, Agent, or Firm* — Pearne & Gordon LLP

(57) ABSTRACT

A first switch transistor and a second switch transistor are turned on concurrently. Thereby a first ReRAM is electrically connected to a first storage node, and a second ReRAM is electrically connected to a second storage node. Complementary SRAM data stored in an SRAM is programmed into a non-volatile memory section of a first memory cell and a second memory cell. One of the first switch transistor and the second switch transistor is turned on to electrically connect only the first ReRAM to the first storage node or to electrically connect only the second ReRAM to the second storage node. Hence, the first memory cell or the second memory cell functions as an independent-type cell in accor- (Continued)

dance with usage. Data is programmed separately into the first memory cell M1$a$ or the second memory cell M1$b$. Thus memory capacity is increased.

9 Claims, 13 Drawing Sheets

(58) Field of Classification Search
CPC ..... G11C 16/0441; G11C 16/10; G11C 11/22; G11C 11/419; G11C 16/14; G11C 11/005; G11C 16/0483
USPC .............. 365/154, 185.08, 156, 158, 185.18, 365/185.29, 189.05, 171, 145, 173, 365/185.05, 189.12, 148
See application file for complete search history.

(56) References Cited

FOREIGN PATENT DOCUMENTS

| | | |
|---|---|---|
| JP | 2013-190893 A | 9/2013 |
| JP | 2014-107406 A | 6/2014 |
| WO | 2004-086512 A1 | 10/2004 |

OTHER PUBLICATIONS

Japanese Office action issued in Japanese Patent Application No. 2014-157136 dated Sep. 4, 2017.

\* cited by examiner

NON-VOLATILE SRAM MEMORY CELL, AND NON-VOLATILE SEMICONDUCTOR STORAGE DEVICE

TECHNICAL FIELD

The present invention relates to a non-volatile semiconductor memory device and is suitably applied to a non-volatile SRAM memory cell in which a plurality of non-volatile memory sections are connected in parallel to an SRAM (Static Random Access Memory), for example.

BACKGROUND ART

Recently non-volatile SRAM memory cell, in which a plurality of non-volatile memory sections are connected in parallel to SRAM, has been known (see Patent document 1, for example). As illustrated in FIG. 13, a conventional non-volatile SRAM memory cell 100 comprises an SRAM 2, a plurality of non-volatile memory sections 104a, 104b, and 104c. Each of the non-volatile memory sections 104a, 104b, and 104c is connected to each of a first storage node SNT and a second storage node SNB of the SRAM 2.

The SRAM 2 is composed of six MOS transistors, namely, first and second access transistors 6a and 6b, each composed of an N-type MOS (Metal-Oxide-Semiconductor) transistor, first and second load transistors 7a and 7b, each composed of a P-type MOS transistor, and first and second drive transistors 8a and 8b, each composed of an N-type MOS transistor.

In the SRAM 2, one end of the first load transistor 7a is connected to one end of the first drive transistor 8a. The SRAM 2 has the first storage node SNT between the first load transistor 7a and the first drive transistor 8a, which are connected in series. In the SRAM 2, one end of the second load transistor 7b is connected to one end of the second drive transistor 8b. The SRAM 2 has the second storage node SNB between the second load transistor 7b and the second drive transistor 8b, which are connected in series. The other end of each of the first load transistor 7a and the second load transistor 7b is connected to a power line VSp. The other end of each of the first drive transistor 8a and the second drive transistor 8b is connected to a reference voltage line VSn.

One end of the first access transistor 6a is connected to the first storage node SNT and a gate of each of the second load transistor 7b and the second drive transistor 8b, and the other end of the first access transistor 6a is connected to a first bit line BLT1. One end of the second access transistor 6b is connected to the second storage node SNB and a gate of each of the first load transistor 7a and the first drive transistor 8a, and the other end of the second access transistor 6b is connected to a second bit line BLB1. Each gate of the first access transistor 6a and the second access transistor 6b is connected to a common word line WL. Each of the first access transistor 6a and the second access transistor 6b turns on or off in accordance with a voltage difference between the word line WL and the first bit line BLT1 or the second bit line BLB1.

External data is written into the SRAM 2 by an external data writing operation, in which a high (-level) potential or a low (-level) potential corresponding to the external data is applied to the first storage node SNT and the second storage node SNB. Thereby the external data is stored as SRAM data in the first storage node SNT and the second storage node SNB.

The non-volatile memory section 104a comprising a pair of a first memory cell M100a and a second memory cell M100b, the non-volatile memory section 104b comprising a pair of a first memory cell M200a and a second memory cell M200b, and the non-volatile memory section 104c comprising a pair of a first memory cell M300a and a second memory cell M300b. The non-volatile memory sections 104a, 104b, 104c are connected in parallel to the SRAM 2. The non-volatile memory sections 104a, 104b, and 104c have the same configuration. Each of the non-volatile memory section 104a (the pair of the first and second memory cells M100a and M100b), the non-volatile memory section 104b (the pair of the first and second memory cells M200a and M200b), and the non-volatile memory section 104c (the pair of the first and second memory cells M300a and M300b) is a complementary-type cell of 2 cells/bit (two cells per bit).

The first memory cells M100a, M200a, and M300a and the second memory cells M100b, M200b, and M300b in the non-volatile memory sections 104a, 104b, and 104c have the same configuration. Hereinafter, the non-volatile memory section 104a in a first row will be described below. In the first memory cell M100a, one end of a first switch transistor 107a is connected to one end of a first resistive random access memory (first ReRAM) RT1. The first switch transistor 107a and the first ReRAM RT1 are connected in series. In the second memory cell M100b, one end of the second switch transistor 107b is connected to one end of a second resistive random access memory (second ReRAM) RB1. The second switch transistor 107b and the second ReRAM RB1 are connected in series.

Each of the first ReRAM (RT1, RT2, and RT3) and the second ReRAM (RB1, RB2, and RB3) is a memory comprising metal oxide, in which a resistance changes when a voltage is applied thereto, and a change in a resistance value is stored therein as data of "1" or "0". In the non-volatile memory section 104a in the first row, the other end of the first ReRAM RT1 in the first memory cell M100a is connected to the other end of the second ReRAM RB1 in the second memory cell M100b. The other ends of the first ReRAM RT1 and the second ReRAM RB1 are connected to a common memory source line MS1. In another row, the other end of the first ReRAM (RT2, RT3) in the first memory cell (M200a, M300a) is connected to the other end of the second ReRAM (RB2, RB3) in the second memory cell (M200b, M300b). The other end of the first ReRAM (RT2, RT3) and the other end of the second ReRAM (RB2, RB3) are connected to a common memory source line (MS2, MS3).

In each of the first memory cell M100a and the second memory cell M100b, a common switch gate line CG1 is connected to the first switch transistor 107a and the second switch transistor 107b. Through one switch gate line CG1, the same voltage is applied to each gate of the first switch transistor 107a and the second switch transistor 107b. Similarly, in a memory cell (M200a, M300a) in another row, a common switch gate line (CG2, CG3) is connected to a first switch transistor (108a, 109a) and a second switch transistor (108b, 109b). Through one switch gate line (CG2, CG3), a common voltage is applied to each gate of the first switch transistor (108a, 109a) and the second switch transistor (108b, 109b) in the same row.

In a case where SRAM data stored in the SRAM 2 is programmed into the first memory cell M100a and the second memory cell M100b in the non-volatile memory section 104a in the first row of the non-volatile SRAM memory cell 100, the voltage Vdd is applied to the switch gate line CG1 in the first row and 0 V is applied to the switch gate lines CG2 and CG3 in the subsequent rows. Thereby, in the non-volatile memory section 104a in the first row, the first and second switch transistors 107a and 107b, which are connected to the switch gate line CG1, are turned on. The first storage node SNT in the SRAM 2 is electrically connected to the first ReRAM RT1 through the first switch transistor 107a. The second storage node SNB is electrically connected to the second ReRAM RB1 through the second switch transistor 107b. Thus the complementary SRAM data is programmed into the first memory cell M100a and the second memory cell M100b.

CITATION LIST

Patent Literature

Patent Literature 1: Japanese Laid-Open Publication No. 2013-190893

SUMMARY OF INVENTION

Technical Problem

In the above-configured non-volatile SRAM memory cell 100, only complementary data is programmed into a pair of first memory cell (M100a, M200a, M300a) and second memory cell (M100b, M200b, M300b) constituting a complementary-type cell of 2 cells/bit (two cells per bit). Although the non-volatile memory sections (104a, 104b, and 104c) comprises the first memory cell (M100a, M200a, M300a) and the second memory cell (M100b, M200b, M300b), data cannot be stored separately in each of the first memory cell (M100a, M200a, M300a) and the second memory cell (M100b, M200b, M300b). It has been desired to develop new circuit configuration in the conventional non-volatile SRAM memory cell 100 that enables programming complementary data in the non-volatile memory section (104a, 104b, and 104c), programming data in each of the first memory cell (M100a, M200a, M300a) and second memory cell (M100b, M200b, M300b) in the non-volatile memory section (104a, 104b, and 104c), and increasing memory capacity.

In view of the foregoing, an object of the present invention is to provide a non-volatile semiconductor memory device capable of programming complementary data into a non-volatile memory section, separately programming data in the non-volatile memory sections in accordance with usage, and increasing memory capacity, and a non-volatile semiconductor memory device.

Solution to Problem

In order to solve the above problems, a non-volatile SRAM memory cell of the present invention comprises an SRAM (static random access memory) having a first storage node and a second storage node complementary to the first storage node, and a plurality of non-volatile memory sections connected in parallel to the SRAM. Each non-volatile memory section comprises a first memory cell allowing electrical connection between the first memory and the first storage node through a first switch transistor, and a second memory cell allowing electrical connection between the second memory and the second storage node through a second switch transistor. The first transistor and the second transistor turn on or off separately from each other.

A non-volatile semiconductor memory device comprises non-volatile SRAM memory cells according to one of aspects of the present invention. The non-volatile SRAM memory cells are disposed in a matrix of rows and columns. The non-volatile SRAM memory cells disposed on one side share the first bit line and the second bit line.

It is preferred that the SRAM has a first storage node disposed between a first load transistor and a first drive transistor. One end of the first transistor is connected to one end of the first drive transistor. It is preferred that the SRAM has a second storage node disposed between a second load transistor and a second drive transistor. It is preferred that the other end of the first load transistor and the other end of the second load transistor are connected to a power line, and the other end of the first drive transistor and the other end of the second drive transistor are connected to a reference voltage line.

It is preferred that in the SRAM comprises a first access transistor and a second access transistor. One end of the first access transistor is connected to a gate of the second load transistor, a gate of the second drive transistor, and the first storage node. Another end of the first access transistor is connected to a first bit line. A gate of the first access transistor is connected a word line. One end of the second access transistor is connected to a gate of the first load transistor, a gate of the first drive transistor, and the second storage node. Another end of the second access transistor is connected to the second bit line. A gate of the first second transistor is connected the word line.

Advantageous Effects of Invention

According to the present invention, the first switch transistor and the second switch transistor are turned on concurrently. Thereby the first memory is electrically connected to the first storage node. The second memory is electrically connected to the second storage node. The complementary SRAM data stored in the SRAM is programmed into the first and second memory cells. One of the first and second switch transistors may be turned on. Thereby only the first memory is electrically connected to the first storage node or only the second memory may be electrically connected to the second storage node. The first and second memory cells may function as independent cells in accordance with the usage. Data may be programmed into one of the first and second memory cells separately. Thus, the memory capacity is increased.

DESCRIPTION OF EMBODIMENTS

With reference to drawings, embodiments of the present invention will be described below.

(1) Circuit Configuration of Non-Volatile SRAM Memory Cell

Figure 1:
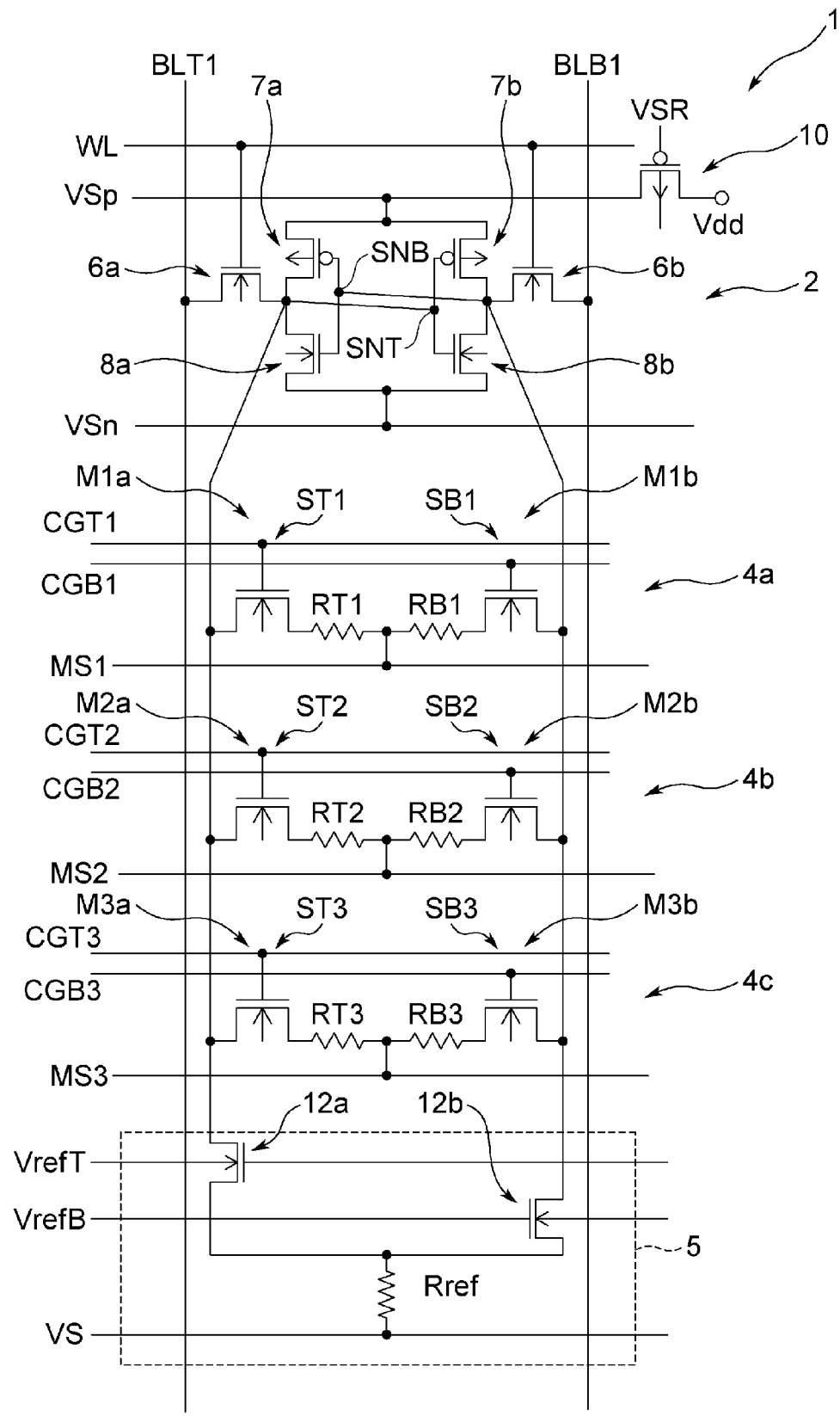
FIG. 1 is a schematic view illustrating circuit configuration of a non-volatile SRAM memory cell according to the present invention.
Figure 13:
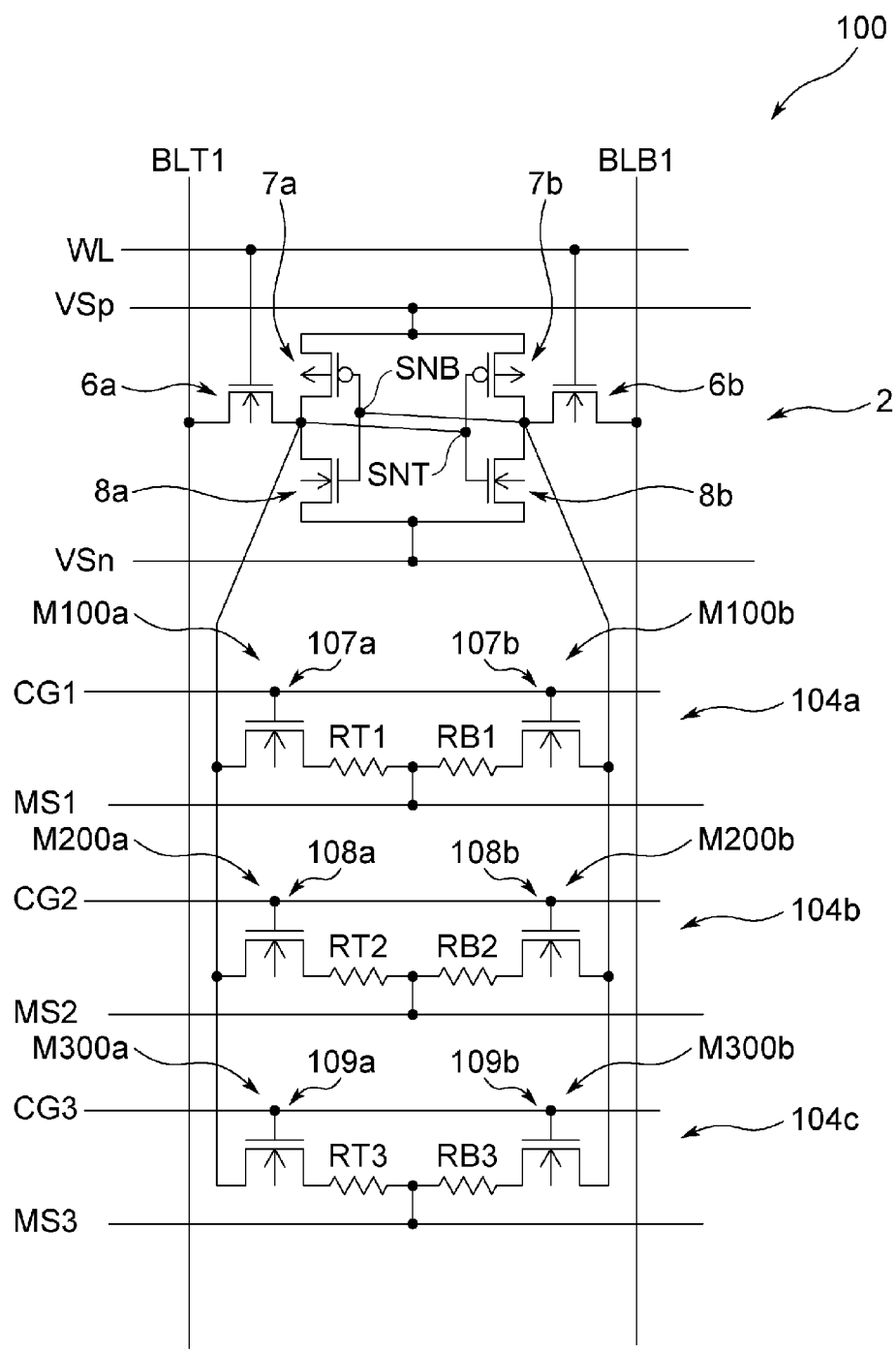
FIG. 13 is a schematic view illustrating circuit configuration of a conventional non-volatile SRAM memory cell.

In FIG. 1, in which parts corresponding to those in FIG. 13 are denoted by the same numerals, a numeral 1 denotes a non-volatile semiconductor memory cell. The non-volatile semiconductor memory cells 1 are disposed in a matrix of rows and columns in a non-volatile semiconductor memory device. An entire drawing of the non-volatile semiconductor memory device is not shown. One of the non-volatile SRAM memory cells 1 will be described below by way of example.

The non-volatile SRAM memory cell 1 of the present invention comprises an SRAM 2, a plurality of non-volatile memory sections 4a, 4b, and 4c, and a node controller 5. In the non-volatile SRAM memory cell 1, the non-volatile memory sections 4a, 4b, and 4c are connected in parallel to a first storage node SNT and a second storage node SNB of the SRAM2, and the node controller 5 is connected to the first storage node SNT, the second storage node SNB, and the non-volatile memory sections 4a, 4b, and 4c. The SRAM 2 has the same configuration as the SRAM 2 in FIG. 13 and the description thereof is omitted.

A power control transistor 10, being a P-type MOS transistor, is provided to a power line VSp connected to the other end of a first load transistor 7a and the other end of a second load transistor 7b of the SRAM 2. One end of the power control transistor 10 is connected to the power line VSp, and a gate of the power control transistor 10 is connected to a power gate line VSR. The power control transistor 10 turns on or off in accordance with a voltage applied to its gate from the power control gate line VSR. A power supply voltage Vdd is applied to the other end of the power control transistor 10. The power control transistor 10 turns off when a predetermined voltage is applied to its gate from the power control gate line VSR. Thereby the voltage Hi-Z or 0 V is applied from the power line VSp to the SRAM 2, and the power supply voltage to the SRAM 2 is blocked. Thus, latching function of the SRAM 2 stops.

In this embodiment, the non-volatile memory sections 4a, 4b, and 4c have the same configuration. The non-volatile memory section (4a, 4b, 4c) comprises a first memory cell (M1a, M2a, M3a) and a second memory cell (M1b, M2b, M3b). The non-volatile memory section 4a in a first row will be described below. In the non-volatile memory section 4a, the first storage node SNT of the SRAM 2 is connected to one end of a first switch transistor ST1 in the first memory cell M1a. The second storage node SNB of the SRAM 2 is connected to one end of a second switch transistor SB1 in the second memory cell M1b.

In this embodiment, the first memory cell M1a comprises the first switch transistor ST1, being an N-type MOS transistor, and a first resistive random access memory (hereinafter abbreviated as first ReRAM) RT1, being a first memory. The other end of the first switch transistor ST1 is connected to one end of the first ReRAM RT1. The second memory cell M1b comprises the second switch transistor SB1, being an N-type MOS transistor, and a second resistive random access memory (hereinafter abbreviated as second ReRAM) RB1, being a second memory. The other end of the second switch transistor SB1 is connected to one end of the second ReRAM RB1. In this embodiment, each of the first ReRAM (RT1, RT2, RT3) connected in series to the first switch transistor (ST1, ST2, ST3) and the second ReRAM (RB1, RB2, RB3) connected in series to the second switch transistor (SB1, SB2, SB3) is a memory in which a resistance value changes when a voltage is applied. For example, in storing data, "1" corresponds to a low resistance value and "0" corresponds to a high resistance value.

In the non-volatile memory section 4a in the first row, one end of the first ReRAM RT1 in the first memory cell M1a is connected to one end of the second ReRAM RB1 of the second memory cell M1b. The other end of the first ReRAM RT1 and the other end of the second ReRAM RB1 are connected to the common memory source line MS1. Similarly, in the non-volatile memory section (4b, 4c) in another row, one end of the first ReRAM (RT2, RT3) in the first memory cell (M2a, M3a) is connected to one end of the second ReRAM (RB2, RB3) in the second memory cell (M2b, M3b). The other end of the first ReRAM (RT2, RT3) and the other end of the second ReRAM (RB2, RB3) are connected to the common memory source line (MS2, MS3).

In the non-volatile memory section 4a, a gate of the first switch transistor ST1 is connected to the first switch gate line CGT1, and the second switch gate line CGB1 is connected to a gate of the second switch transistor SB1. In the non-volatile memory section 4a, different switch gate voltages are applied separately to the first switch transistor ST1 and the second switch transistor SB1 through the first switch gate line CGT1 and the second switch gate line CGB1, respectively. The first switch transistor ST1 and the second switch transistor SB1 are turned on or off separately from each other by a voltage difference between the corresponding end and the gate.

In the non-volatile SRAM memory cell 1, the electrical connection between the SRAM 2 and the non-volatile memory section (4a, 4b, 4c) is disconnected by the first switch transistor (ST1, ST2, ST3) and the second switch transistor (SB1, SB2, SB3). To perform the external data writing operation, in which the external data is written into the SRAM 2 through the first bit line BLT1 and the second bit line BLB1, or SRAM data readout operation, in which the SRAM data is read out through the first bit line BLT1 and the second bit line BLN1, the SRAM 2 is used as a normal SRAM 2 by turning off the first switch transistor (ST1, ST2, ST3) and the second switch transistor (SB1, SB2, SB3) to disconnect the electrical connection between the non-volatile memory section (4a, 4b, and 4c) and the SRAM 2.

In the memory section 4a, the first and second switch transistors ST1 and SB1 are turned on. Thereby the first ReRAM RT1 of the first memory cell M1a is electrically connected to the first storage node SNT and the second ReRAM RB1 of the second memory cell M1b is electrically connected to the second storage node SNB. Different switch gate voltages are applied to the gates of the first switch transistor ST1 and the second switch transistor SB1 through the first switch gate line CGT1 and the second switch gate line CGB1, respectively. The non-volatile memory section 4a is capable of electrically connecting only the first ReRAM RT1 of the first memory cell M1a to the first storage node SNT by turning on only the first switch transistor ST1 of the first memory cell M1a while turning off only the second switch transistor SB1 of the second memory cell M1b to disconnect the electrical connection between the second ReRAM RB1 of the second memory cell M1b and the second storage node SNB.

The non-volatile memory section 4a is capable of electrically connecting only the second ReRAM RB1 of the second memory cell M1b to the second storage node SNB by turning on only the second ReRAM RB1 of the second memory cell M1b while turning off the first switch transistor ST1 of the first memory cell M1a to disconnect the electrical connection between the first ReRAM RT1 of the first memory cell M1a and the first storage node SNT.

In the non-volatile memory section (4b, 4c) of another row, different switch gate voltages are applied to the gate of the first switch transistor (ST2, ST3) and the gate of the second switch transistor (SB2, SB3) through the first switch gate line (CGT2, CGT3) and the second switch gate line (CGB2, CGB3), respectively. Thus, the non-volatile memory section (4b, 4c) is capable of turning on only one of the first switch transistor (ST2, ST3) and the second switch transistor (SB1, SB2) of the first memory cell (M2a, M3a) and the second memory cell (M2b, M3b).

Hereinafter, the first storage node SNT and the second storage node SNB of the SRAM 2 and a node controller 5 connected to the non-volatile memory sections 4a, 4b, and 4c are described. The node controller 5 comprises first and second node control transistors 12a and 12b, being N-type MOS transistors, for example, and a resistor element Rref. One end of the first node control transistor 12a is connected to the first storage node SNT of the SRAM 2 and to ends of the switch transistors ST1, ST2, and ST3 of the non-volatile memory sections 4a, 4b, and 4c. The other end of the first node control transistor 12a is connected to one end of the resistor element Rref. A gate of the first node control transistor 12a is connected to a first node control gate line VrefT. The first node control transistor 12a is turned on or off by a voltage applied through the first node control gate line VrefT.

One end of the second node control transistor 12b is connected to the second storage node SNB of the SRAM2 and to ends of the second switch transistors SB1, SB2, and SB3 of the non-volatile memory sections 4a, 4b, and 4c. The other end of the second node control transistor 12b is connected to one end of the resistor element Rref. A gate of the second node control transistor 12b is connected to the second node control gate line VrefB. The second node control transistor 12b is turned on or off by a voltage applied through the second node control gate line VrefB. A node control source line VS is connected to the other end of the resistor element Rref, which is connected to the other ends of the first and second node control transistors 12a and 12b.

The non-volatile SRAM memory cell having the above-described configuration according to the present invention uses the node controller 5 to make each of the non-volatile memory sections 4a, 4b, and 4c function as a complementary-type cell of 2 cells/1 bit (two cells per bit) or an independent-type cell of 2 cells/2 bits (two cells per two bits). Thus, the non-volatile SRAM memory cell 1 selectively makes each of the non-volatile memory sections 4a, 4b, and 4c function as a complementary-type cell or an independent-type cell in accordance with the usage.

Figure 2:
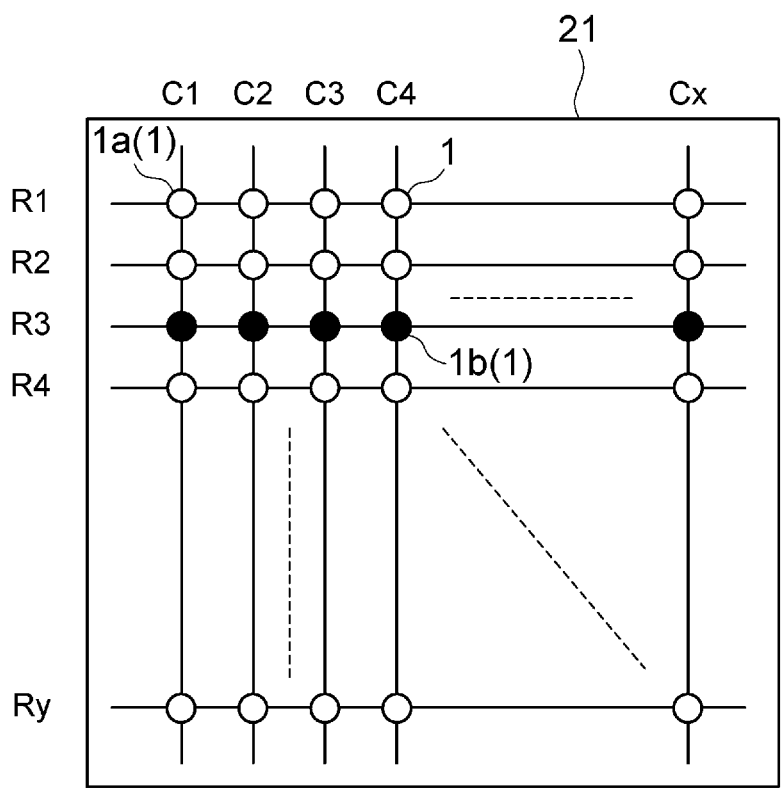
FIG. 2 is a schematic view illustrating background operation performed by the non-volatile SRAM memory cells disposed in a matrix of rows and columns.

FIG. 2 shows a non-volatile semiconductor memory device 21, in which the non-volatile SRAM memory cells 1 are disposed in a matrix of Ry rows and Cx columns. In the drawing, the non-volatile SRAM memory cells 1 are denoted by black circles and white circles. Of the non-volatile SRAM memory cells 1 disposed in the matrix in FIG. 2, non-volatile SRAM memory cells 1b denoted by the black circles and located in a third row R3 represent the non-volatile SRAM memory cells having access to the SRAM 2 to write external data into the SRAM 2 or to read out SRAM data stored in the SRAM 2, for example. Of the non-volatile SRAM memory cells 1 disposed in the matrix in FIG. 2, non-volatile SRAM memory cells 1a denoted by the white circles represent the non-volatile SRAM memory cells not having access to the SRAM 2.

As illustrated in FIG. 2, even when the non-volatile SRAM memory cells 1b are accessing the SRAM 2, the non-volatile SRAM memory cells 1a (including the non-volatile SRAM memory cells 1a disposed in the same row as the non-volatile SRAM memory cells 1b and share the first bit line BLT1 and the second bit line BLB1 with the non-volatile SRAM memory cells 1b) are capable of executing SRAM writing operation, memory programming operation, or non-volatile data erasing operation in the background. The SRAM writing operation is to write non-volatile data, stored in the non-volatile memory section (4a, 4b, 4c), into the SRAM2. The memory programming operation is to program the SRAM data, stored in the SRAM 2, into one of the non-volatile memory sections 4a, 4b, and 4c. The non-volatile data erasing operation is to erase the non-volatile data stored in the non-volatile memory section (4a, 4b, 4c).

Following descriptions describe each of the SRAM writing operation, the memory programming operation, and the memory erasing operation (hereinafter may referred to as background operation) performed in the background when the non-volatile memory section (4a, 4b, 4c) functions as the complementary-type cell or the independent-type cell.

Figure 3:
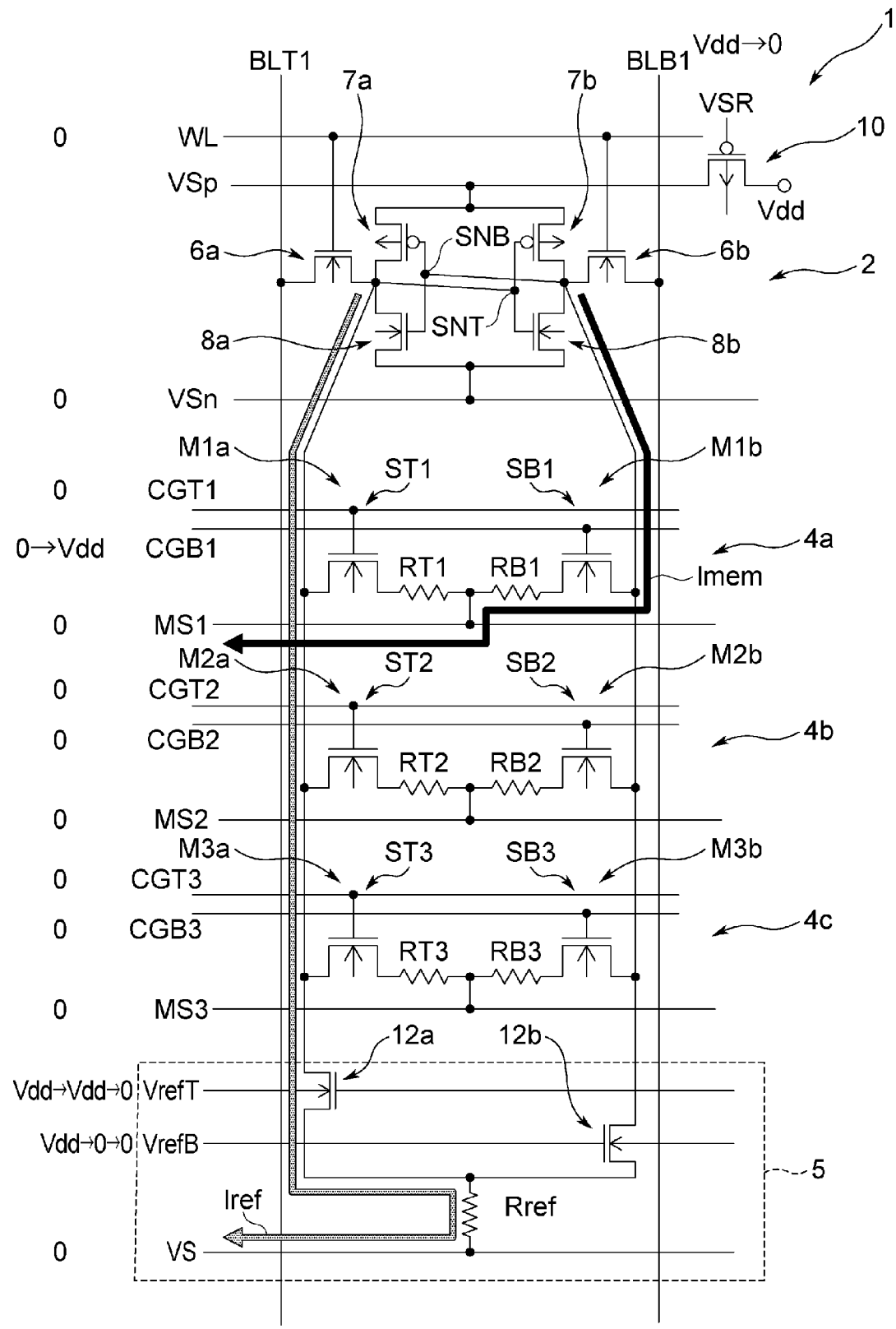
FIG. 3 is a schematic view illustrating SRAM writing operation in a case where the non-volatile memory section functions as an independent-type cell.

(2) SRAM Writing Operation (2-1) An Example in which a Non-Volatile Memory Section Functions as an Independent-Type Cell FIG. 3 shows a circuit diagram of the non-volatile SRAM memory cell 1 shown in FIG. 1 with an example of voltage values at corresponding sites in a case where the non-volatile memory section 4a in the first row functions as an independent-type cell. For example, the non-volatile data stored in the second memory cell M1b of the non-volatile memory section 4a is written into the second storage node SNB of the SRAM 2. In this case, 0 V is applied to the word line WL to turn off the first access transistor 6a and the second access transistor 6b of the SRAM 2. Thereby the electrical connection between the SRAM 2 and the first bit line BLT1 and the electrical connection between the SRAM 2 and the second bit line BLB1 are disconnected. The power control transistor 10 is turned off by applying a voltage Vdd to the gate of the power control transistor 10 through the power control gate line VSR. Thereby the application of the power supply voltage Vdd to the power line VSp is cut off, to stop the latch function of the SRAM 2.

At this time, 0 V is applied to each of the first switch gate lines CGT1, CGT2, and CGT3 and the second switch gate lines CGB1, CGB2, and CGB3, and 0 V is applied to each of the first switch transistors ST1, ST2, and ST3 and the second switch transistors SB1, SB2, and SB3. Thereby all of the first switch transistors ST1, ST2, and ST3 and the second switch transistors SB1, SB2, and SB3 are turned off. The voltage Vdd is applied to each of the first and second node control gate lines VrefT and the VrefB. The voltage Vdd is applied to each of the gate of the first node control transistor 12a and the gate of the second node control transistor 12b.

Thereby the first and second node control transistors 12a and 12b are turned on. Hence the first and second storage nodes SNT and SNB of the SRAM 2 are connected to the node control source line VS to which 0 V is applied. The potentials of the first and second storage nodes SNT and SNB are 0 V. Thus, in the SRAM 2, the potentials of the first and second storage nodes are 0 V, and the first and second storage nodes are in an initial state, in which no data has been written.

For example, in a case where only the non-volatile data "1" or "0" stored in the second memory cell M1b of the non-volatile memory section 4a in the first row is written into the second storage node SNB of the SRAM 2, the voltage Vdd is applied to the second switch gate line CGB1 disposed in the non-volatile memory section 4a. Thereby, only the second switch transistor SB1 is turned on by the voltage applied to the second switch gate line CGB1. Hence, in the non-volatile memory section 4a, the second switch transistor SB1 electrically connects the second ReRAM RB1 to the second storage node SNB while the first switch transistor ST1 disconnects the electrical connection between the first ReRAM RT1 and the first storage node SNT.

The voltage Vdd is continuously applied to the first node control gate line VrefT of the node controller 5, but the voltage 0 V is applied to the second node control gate line VrefB. The first node control transistor 12a is kept turned on by the voltage Vdd applied to the gate of the first node control transistor 12a through the first node control gate line VrefT. The second node control transistor 12b to which 0 V is applied to the gate of the second node control transistor 12b through the second node control transistor VrefB is turned off. Thus, in the non-volatile SRAM memory cell 1, the first storage node SNT into which the non-volatile data is not to be written is electrically connected to the node control source line VS through the first node control transistor 12a and the resistor element Rref. The second storage node SNB into which the non-volatile data is to be written is electrically connected to the second ReRAM RB1 through the second switch transistor SB1 of the non-volatile memory section 4a.

Thereafter, in the non-volatile SRAM memory cell 1, 0 V is applied to the power control gate line VSR, to which the voltage Vdd has been applied, to turn on the power control transistor 10 connected to the power control gate line VSR. Thereby, the voltage Vdd which has been blocked by the power control transistor 10 is applied to the power line VSp, to recover the latch function of the SRAM 2. The potential of the second storage node SNB becomes higher or lower than that of the first storage node SNT, depending on magnitude relationship between a memory current Imem and a reference current Iref. The memory current Imem flows from the second storage node SNB to the second ReRAM RB1 through the second switch transistor SB1 of the non-volatile memory section 4a. The reference current Iref flows form the first storage node SNT to the resistor element Rref through the first node control transistor 12a.

Figure 4:
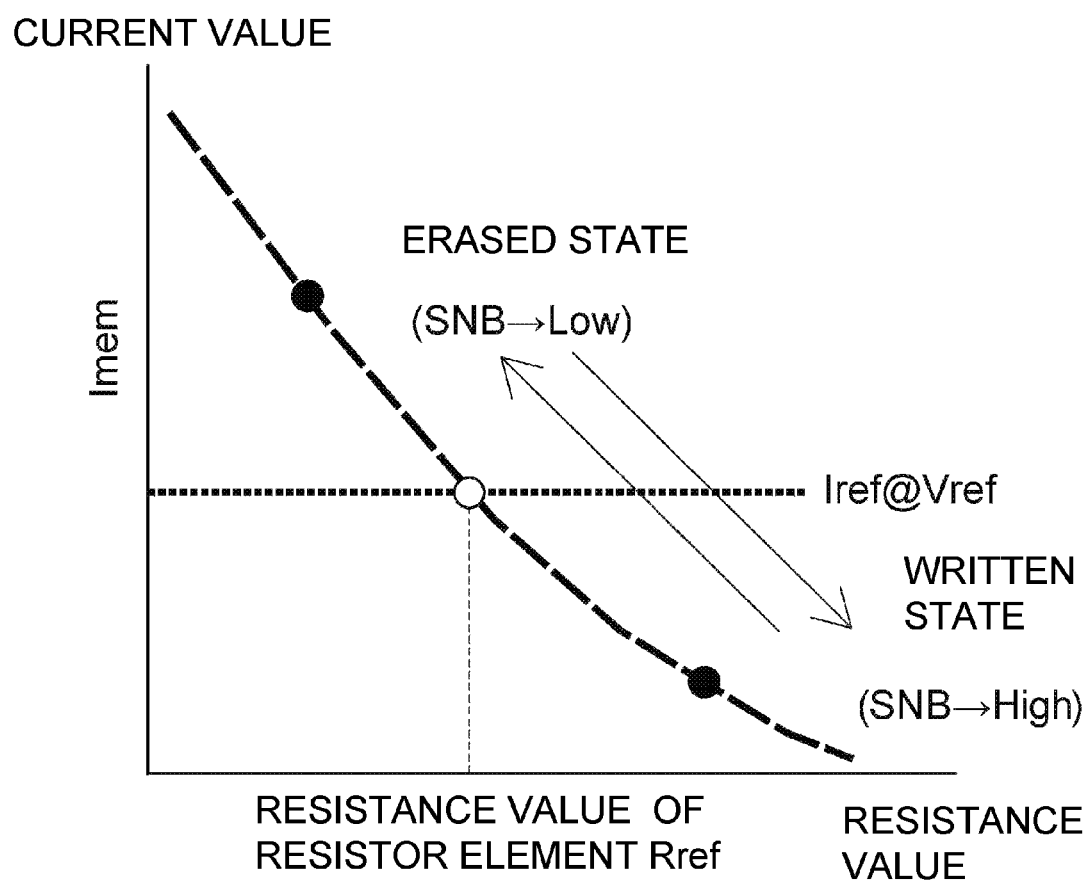
FIG. 4 is a graph showing relationships between a reference current and a memory current in a state where data is programmed into the first memory cell and in a state where data is erased from the first memory cell.

As illustrated in FIG. 4 by way of example, in a case where the resistance value of the second ReRAM RB1 is high, the second memory cell M1b is in a state (hereinafter referred to as "programming state") of storing the non-volatile data "0". In a case where the resistance value of the second ReRAM RB1 is low, the second memory cell M1b is in a state (hereinafter referred to as "erasing state") of storing the non-volatile data "1". Hereinafter, changes in the potentials of the first and second storage nodes SNT and SNB will be described below. In a case where the second memory cell M1b stores the non-volatile data "1" and the resistance value of the second ReRAM RB1 is lower than that of the resistor element Rref, the memory current Imem on the second storage node SNB is likely to flow to the second ReRAM RB1 with the low resistance value. Hence the potential of the second storage node SNB is lowered by the voltage 0 V on the memory source line MS1.

Thereby, in the SRAM 2, the potential at the gate of the first load transistor 7a, which is connected to the second storage node SNB, drops. Hence the first load transistor 7a turns on, and the power supply voltage Vdd on the power line VSp is applied to the first storage node SNT through the first load transistor 7a. Thus, the potential of the first storage node SNT is at a High level. The second drive transistor 8b with its gate connected to the first storage node SNT at the High level is turned on, and the 0 V on the reference voltage line VSn is applied to the second storage node SNB. Thus, the potential of the second storage node SNB is at the Low level. In the case where the memory current Imem is higher than the reference current Iref in the SRAM 2, the second storage node SNB connected to the second ReRAM RB1 is latched to the low potential, and the non-volatile data "1" (corresponding to the low potential) stored in the second memory cell M1b is written into the second storage node SNB. Finally, 0 V is applied to each of the second switch gate line CGB1 and the first node control gate line VrefT, to which the voltage Vdd has been applied. Thereby the second switch transistor SB1 and the first node control transistor 12a are turned off. Thus, the SRAM writing operation, in which only the non-volatile data of the second memory cell M1b is written into the SRAM 2, is completed.

In a case where the second memory cell M1b stores the non-volatile data "0" and the resistance value of the second ReRAM RB1 is higher than that of the resistor element Rref, the memory current Imem from the second storage node SNB is not likely to flow to the second ReRAM RB1 with the high resistance value. Hence the reference current Iref, which flows from the first storage node SNT to the resistor element Rref through the first node control transistor 12a is higher than the memory current Imem, and the potential of the first storage node SNT drops. Due to this, the potential at the gate of the second load transistor 7b connected to the first storage node SNT drops. Hence, the second load transistor 7b turns on, and the power supply voltage Vdd on the power line VSp is applied to the second storage node SNB through the second load transistor 7b. Thus, the potential of the second storage node SNB is at a High level. In the case where the reference current Iref is higher than the memory current Imem in the SRAM 2, the second storage node SNB connected to the second ReRAM RB1 is latched to the high potential, and the non-volatile data "0" (corresponding to the high potential) stored in the second memory cell M1b is written into the second storage node SNB.

The first drive transistor 8a with its gate connected to the second storage node SNB at the High level turns on, to apply 0 V on the reference voltage line VSn to the first storage node SNT. Thereby the first storage node SNT is latched to the low potential. Finally, 0 V is applied to each of the second switch gate line CGB1 and the first node control gate line VrefT, to which the voltage Vdd has been applied. Thereby the second switch transistor SB1 and the first node control transistor 12a are turned off. Thus the SRAM writing operation in which only the non-volatile data of the second memory cell M1b is written into the SRAM 2 is completed.

As described above, in the present invention, the SRAM memory cell 1 provided with the node controller 5 is capable of supplying the reference current Iref from the SRM 2 to the node control source line VS through the node controller 5, without supplying the reference current Iref to the first and second bit lines BLT1 and BLB1. Hence, the above-described SRAM writing operation in the non-volatile SRAM memory cell 1 of the present invention is performed in a state where SRAM 2 is electrically disconnected from the first and second bit lines BLT1 and BLB1 by applying 0 V to the word line WL to turn off the first and second access transistors 6a and 6b connected to the word line WL. Thus, the SRAM writing operation is executed within the non-volatile SRAM memory cell 1.

Of the non-volatile SRAM memory cells 1 disposed, for example, in a matrix in the non-volatile semiconductor memory device, even when one or more of the non-volatile SRAM memory cells access the SRAM 2 through turning on the first and second access transistors 6a and 6b to electrically connect the first and second bit lines BLT1 and BLB1 to the SRAM2, the electrical connection between the SRAM 2 in the non-volatile SRAM memory cell 1 in another row and the first and second bit lines BLT1 and BLB1 can be disconnected. Thus, the non-volatile semiconductor memory device executes the SRAM writing operation as the background operation.

Figure 5:
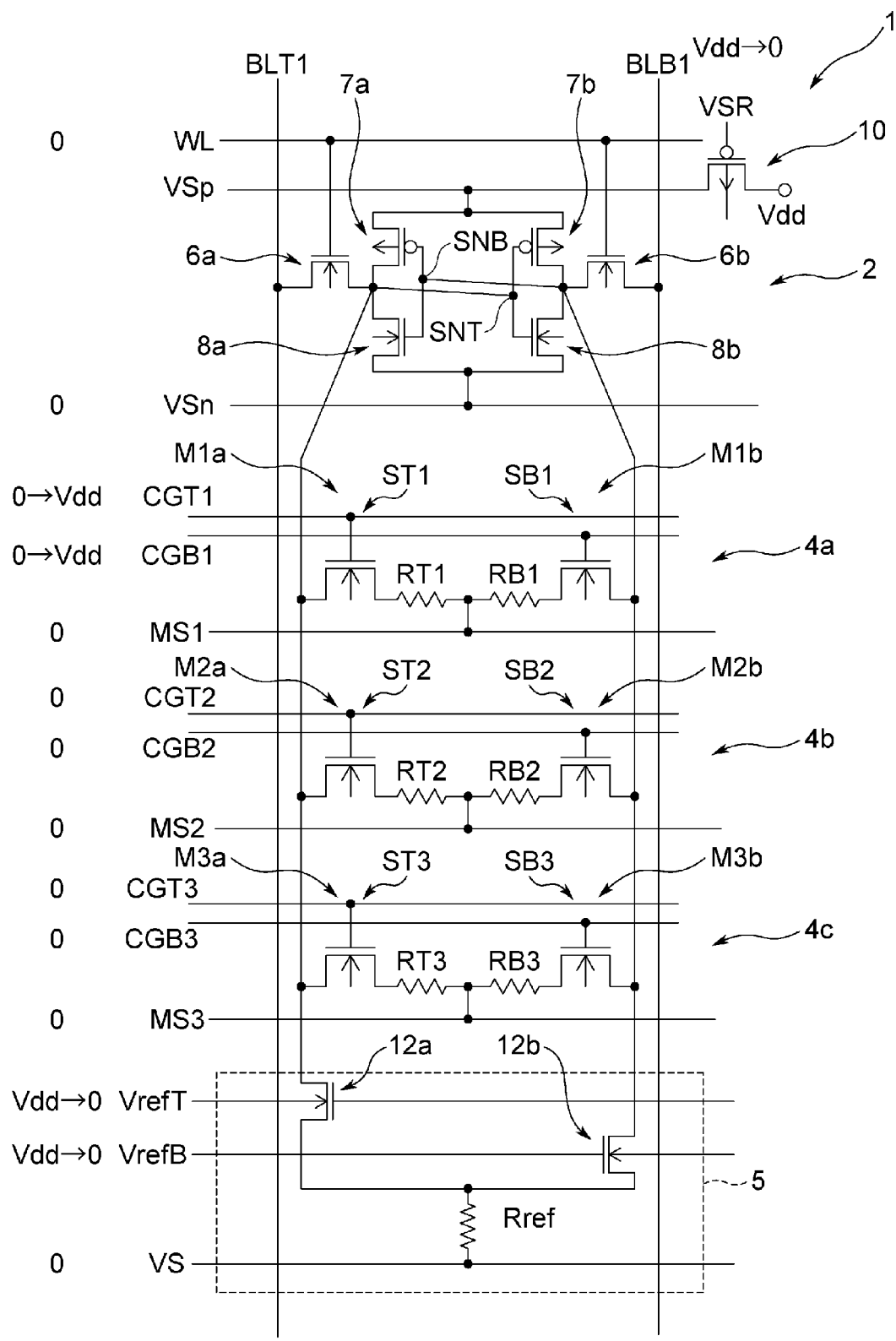
FIG. 5 is a schematic view illustrating SRAM writing operation in a case where the non-volatile memory section functions as a complementary-type cell.

(2-2) An Example in Which the Non-Volatile Memory Section Functions as a Complementary-Type Cell FIG. 5 is a circuit diagram of the non-volatile SRAM memory cell 1 shown in FIG. 1 with an example of voltage values at corresponding sites in a case where the non-volatile memory section 4a in the first row functions as the complementary memory cell. For example, the non-volatile data stored in the first and second memory cells M1a and M1b of the non-volatile memory section 4a are written into the SRAM 2. In this case, 0 V is applied to the word line WL to turn off the first and second access transistors 6a and 6b. Thereby the electrical connection between the SRAM 2 and the first bit line BLT1 and the electrical connection between the SRAM 2 and the second bit line BLB1 are disconnected. The power control transistor 10 is turned off by applying the voltage Vdd from the power control gate line VSR to the gate of the power control transistor 10. Thereby the power supply voltage Vdd to be applied to the power line VSp is blocked and the latch function of the SRAM 2 stops.

At this time, 0 V is applied to each of the first switch gate lines CGT1, CGT2, CGT3 and the second switch gate lines CGB1, CGB2, and CGB3, and 0V is applied to each gate of the first switch transistors ST1, ST2, ST3 and the second switch transistors SB1, SB2, SB3. Thereby all of the first switch transistors ST1, ST2, and ST3 and the second switch transistors SB1, SB2, and SB3 are turned off. At this time, the voltage Vdd is applied to the first and second node control gate lines VrefT and VrefB. The voltage Vdd is applied to the first and second node control transistors 12a and 12b.

Thereby the first and second node control transistors 12a and 12b turn on to connect the first and second storage nodes SNT and SNB of the SRAM 2 to the node control source line VS to which 0V is applied. Thus the potentials of the first and second storage nodes SNT and SNB are 0 V. Thus, in the SRAM 2, the potentials of the first and second storage nodes SNT and SNB are 0 V, and the first and second storage nodes SNT and SNB are in the initial state, in which no data has been written. Then, 0 V is applied to the first and second node control gate lines VrefT and VrefB to which the voltage Vdd has been applied. Thereby the first and second node control transistors 12a and 12b are turned off.

For example, in a case where complementary non-volatile data stored in the first and second memory cell M1a and M1b of the non-volatile memory section 4a in the first row is written into the SRAM, the voltage Vdd is applied to each of the first and second switch gate lines CGT1 and CGB1 disposed in the non-volatile memory section 4a. Thereby each of the first switch transistor ST1 with its gate connected to the first switch gate line CGT1 and the second switch transistor SB1 with its gate connected to the second switch gate line CGB1 is turned on. Thus, in the non-volatile memory section 4a, the first switch transistor ST1 electrically connects the first ReRAM RT1 to the first storage node SNT, and the second switch transistor SB1 electrically connects the second ReRAM RB1 to the second storage node SNB.

Then, in the non-volatile SRAM memory cell 1, 0 V is applied to the power control gate line VSR to which the voltage Vdd has been applied, and the power control transistor 10 connected to the power control gate line VSR is turned on. Thereby the power supply voltage Vdd, which has been blocked by the power control transistor 10, is applied to the power line VSp. Hence the latch function of the SRAM 2 is recovered. The potential of the second storage node SNB may become higher or lower than the potential of the first storage node SNT, depending on the magnitude relationship between the memory current flowing from the first storage node SNT to the first ReRAM RT1 through the first switch transistor ST1 of the non-volatile memory section 4a and the memory current flowing from the second storage node SNB to the second ReRAM RB1 through the second switch transistor SB1 of the non-volatile memory section 4a.

For example, the first memory cell M1a stores the non-volatile data "0" and the second memory cell M1b stores the non-volatile data "1". In the second memory cell storing the non-volatile data "1", the resistance value of the second ReRAM RB1 is lower than the resistance value of the first ReRAM RT1. Hence, in the non-volatile SRAM memory cell 1, the memory current from the first storage node SNT is not likely to flow to the first ReRAM RT1 with the high resistance value. The memory current from the second storage node SNB is likely to flow to the second ReRAM RB1 with the low resistance value. Hence the potential of the second storage node SNB electrically connected to the memory source line MS1 of 0 V drops.

Thereby the potential at the gate of the first load transistor 7a connected to the second storage node SNB drops in the SRAM 2. Hence the first load transistor 7a turns on to apply the power supply voltage Vdd from the power line VSp to the first storage node SNT through the first load transistor 7a. Thus the potential of the first storage node SNT is at a High level. The second drive transistor 8b with its gate connected to the first storage node SNT of the high potential turns on to apply 0 V through the reference voltage line VSn to the second storage node SNB. Thus the potential of the second storage node SNB is at a Low level.

Hence, in the SRAM 2, the memory current flowing in the second ReRAM RB1 is higher than the memory current flowing in the first ReRAM RT1. The second storage node SNB connected to the second ReRAM RB1 is latched to a low potential, and the non-volatile data "1" (corresponding to the low potential) stored in the second memory cell M1b is written into the second storage node SNB. In the SRAM 2, the first storage node SNT connected to the ReRAM RT1 is latched to a high potential, and the non-volatile data "0" (corresponding to the high potential) stored in the first memory cell M1a is written into the first storage node SNT.

Finally, 0 V is applied to each of the first and second switch gate lines CGT1 and CGB1 to which the voltage Vdd has been applied, to turn off the first and second switch transistors ST1 and SB1. Thus, the SRAM writing operation in which the complementary non-volatile data of the non-volatile memory section 4a is written is completed.

Similar to the descriptions in "(2-1) An example in which a non-volatile memory section functions as an independent-type cell", the non-volatile semiconductor memory device in which the non-volatile SRAM memory cells 1 are disposed in a matrix is capable of executing the SRAM writing operation in a state that the first and second bit lines BLT1 and BLB1 are electrically disconnected by turning off the first and second access transistors 6a and 6b in each non-volatile SRAM memory cell 1. Of the non-volatile SRAM memory cells 1 disposed in a matrix, even when one or more of the non-volatile SRAM memory cells are electrically connected to the first and second bit lines BLT1 and BLB1 to access the SRAM 2, the non-volatile SRAM memory cells 1 in another row are capable of disconnecting the electrical connection between the SRAM 2 and the first and second bit lines BLT1 and BLB1. Thus, the non-volatile semiconductor memory device executes the SRAM writing operation as the background operation.

Figure 6:
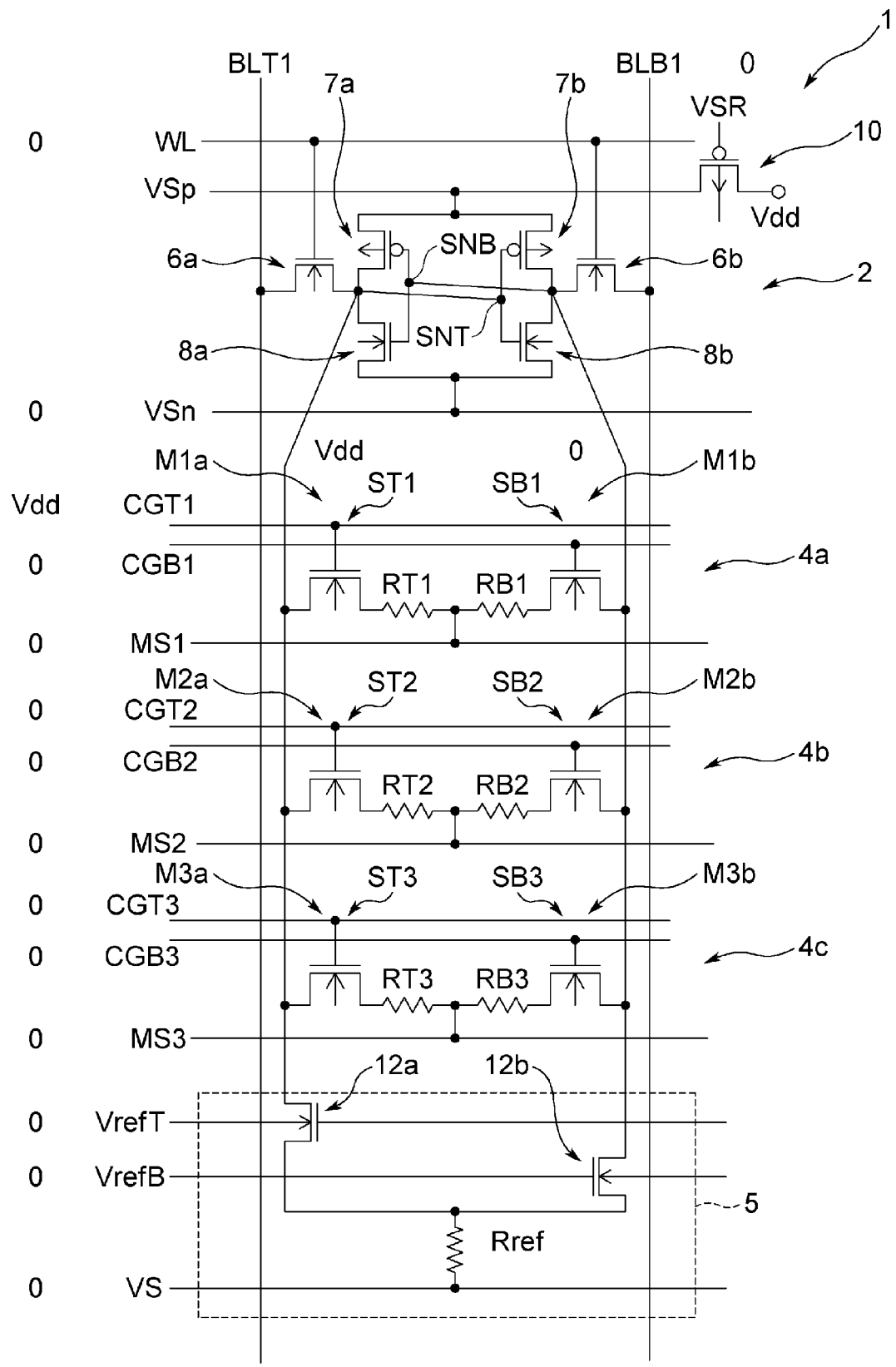
FIG. 6 is a schematic view illustrating memory programming operation in a case where the non-volatile memory section functions as an independent-type cell.

(3) Memory Programming Operation (3-1) An Example in Which a Non-Volatile Memory Section Functions as an Independent-Type Cell FIG. 6 shows a circuit diagram of the non-volatile SRAM memory cell 1 shown in FIG. 1 with an example of voltage values at corresponding sites in a case where the non-volatile memory section 4a in the first row functions as the independent-type cell. For example, the SRAM data of a high potential or a low potential stored in the first storage node SNT of the SRAM 2 is programmed into only the first memory cell M1a of the non-volatile memory section 4a. In this case, 0 V is applied to the word line WL to turn off the first access transistor 6a and the second access transistor 6b of the SRAM 2. Thereby the electrical connection between the SRAM 2 and the first bit line BLT1 and the electrical connection between the SRAM 2 and the second bit line BLB1 are disconnected. The power control transistor 10 is turned on by applying 0 V to the gate of the power control transistor 10 through the power control gate line VSR. The power supply voltage Vdd applied to the other end of the power control transistor 10 is applied to the power line VSp, to allow the latch function of the SRAM 2.

At this time, 0 V is applied to the first and second node control gate lines VrefT and VrefB, and each of the first and second node control transistors 12a and 12b is turned off to be electrically disconnected from the SRAM 2. The voltage Vdd is applied only to the first switch gate line CGT1 disposed in the non-volatile memory section 4a while 0 V is applied to the first switch gate lines CGT2 and CGT3 and the second switch gate lines CGB1, CGB2, and CGB3. Thereby, only the first switch transistor ST1 of the non-volatile memory section 4a connected to the first switch gate line CGT1 to which the voltage Vdd is applied is turned on while the first switch transistors ST2 and ST3 and the second switch transistors SB1, SB2, and SB3 are turned off.

Thus, in the non-volatile SRAM memory cell 1, the first storage node SNT of the SRAM 2 is electrically connected to the first ReRAM RT1 connected to the first switch transistor ST1 in the non-volatile memory section 4a in the first row. Hence, the potential of the first storage node SNT changes the resistance value of the first ReRAM RT1. In this case, the first ReRAM RT1, to which the SRAM data is to be programmed, is set to a low resistance state and data is initialized in advance.

In a case where the first storage node SNT of the SRAM 2 is at the high potential, the high potential is transmitted from the first storage node SNT to the first ReRAM RT1 through the first switch transistor ST1. Thereby the first ReRAM RT1 that has been set to the low resistance state is changed (switched) to a high resistance state, that is, a state in which the non-volatile data "0" has been programmed into the first memory cell M1a. In a case where the first storage node SNT of the SRAM 2 is at the low potential, the low potential is transmitted from the first storage node SNT to the first ReRAM RT1 through the first switch transistor ST1. The state of the first ReRAM RT1, which has been set to the low resistance state, is maintained, namely, the non-volatile data "1" is programmed into the first memory cell M1a.

Figure 7:
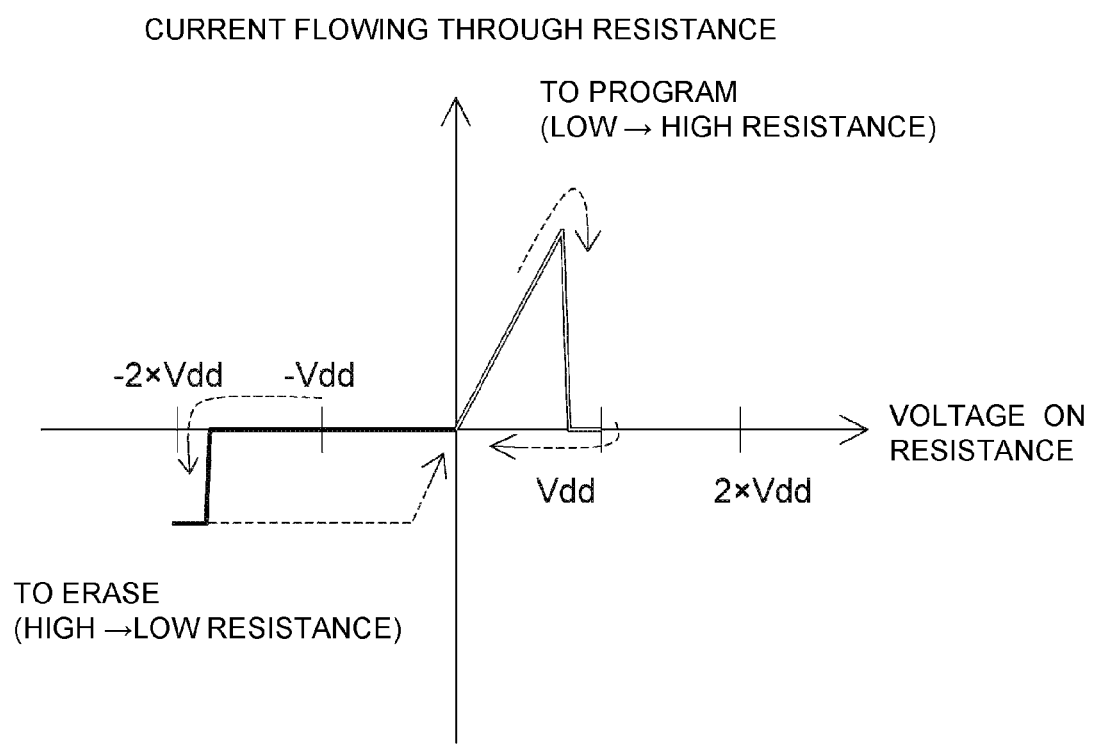
FIG. 7 is a schematic view illustrating memory programming operation in a case where the non-volatile memory section functions as the complementary-type cell.

In this embodiment, as illustrated in FIG. 7, the first ReRAM RT1 and the second ReRAM RB1 are switched from high resistance to low resistance by a voltage less than Vdd. For example, the low resistance state is defined as "erased state" (that is, a state in which non-volatile data "1" is stored). In a case where the high potential is transmitted from the first storage node SNT to the first ReRAM RT1 through the first switch transistor ST1, the first ReRAM RT1 switches from the low resistance state to the high resistance state. Thereby the non-volatile data "0" is programmed into the first memory cell M1a.

In the non-volatile memory section 4a, the second switch transistor SB1 is turned off to disconnect the electrical connection between the second storage node SNB of the SRAM 2 and the second ReRAM RB1. Hence the SRAM data of the second storage node SNB is not programmed into the second memory cell M1b while the SRAM data of the first storage node SNT is programmed only into the first memory cell M1a. Thus the non-volatile memory section 4a functions as the independent-type cell.

Of the non-volatile SRAM memory cells 1 disposed, for example, in a matrix in the non-volatile semiconductor memory device, even when one or more of the non-volatile SRAM memory cells access the SRAM 2 through turning on the first and second access transistors 6a and 6b to electrically connect the first and second bit lines BLT1 and BLB1 to the SRAM2, the non-volatile SRAM memory cells 1 in another row are capable of disconnecting the electrical connection between the SRAM 2 and the first and second bit lines BLT1 and BLB1. Thus, the non-volatile semiconductor memory device executes the SRAM writing operation as the background operation.

(3-2) An Example in which a Non-Volatile Memory Section Functions as a Complementary-Type Cell For example, to make the non-volatile memory section 4a in the first row function as the complementary-type cell, the voltage Vdd is applied to the first and second switch gate lines CGT1 and CGB1 in the first row, to turn on the first and second switch transistors ST1 and SB1. Thereby, in the non-volatile SRAM memory cell 1, the first storage node SNT of the SRAM 2 is electrically connected to the first ReRAM RT1 connected to the first switch transistor ST1 in the non-volatile memory section 4a in the first row, and the resistance value of the first ReRAM RT1 is changed by the potential of the first storage node SNT. At this time, the second storage node SNB of the SRAM 2 is electrically connected to the second ReRAM RB1 connected to the second switch transistor SB1 in the non-volatile memory section 4a in the first row. The potential of the second storage node SNB changes the resistance value of the second ReRAM RB1. Thus, the complementary SRAM data stored in the SRAM 2 is programmed into the first and second memory cells M1a and M1b.

Of the non-volatile SRAM memory cells 1 disposed, for example, in a matrix in the non-volatile semiconductor memory device, even when one or more of the non-volatile SRAM memory cells access the SRAM 2 through turning on the first and second access transistors 6a and 6b to electrically connect the first and second bit lines BLT1 and BLB1 to the SRAM2, the non-volatile SRAM memory cells 1 in another row are capable of disconnecting the electrical connection between the SRAM 2 and the first and second bit lines BLT1 and BLB1. Thus, the non-volatile semiconductor memory device executes the SRAM writing operation as the background operation.

Figure 8:
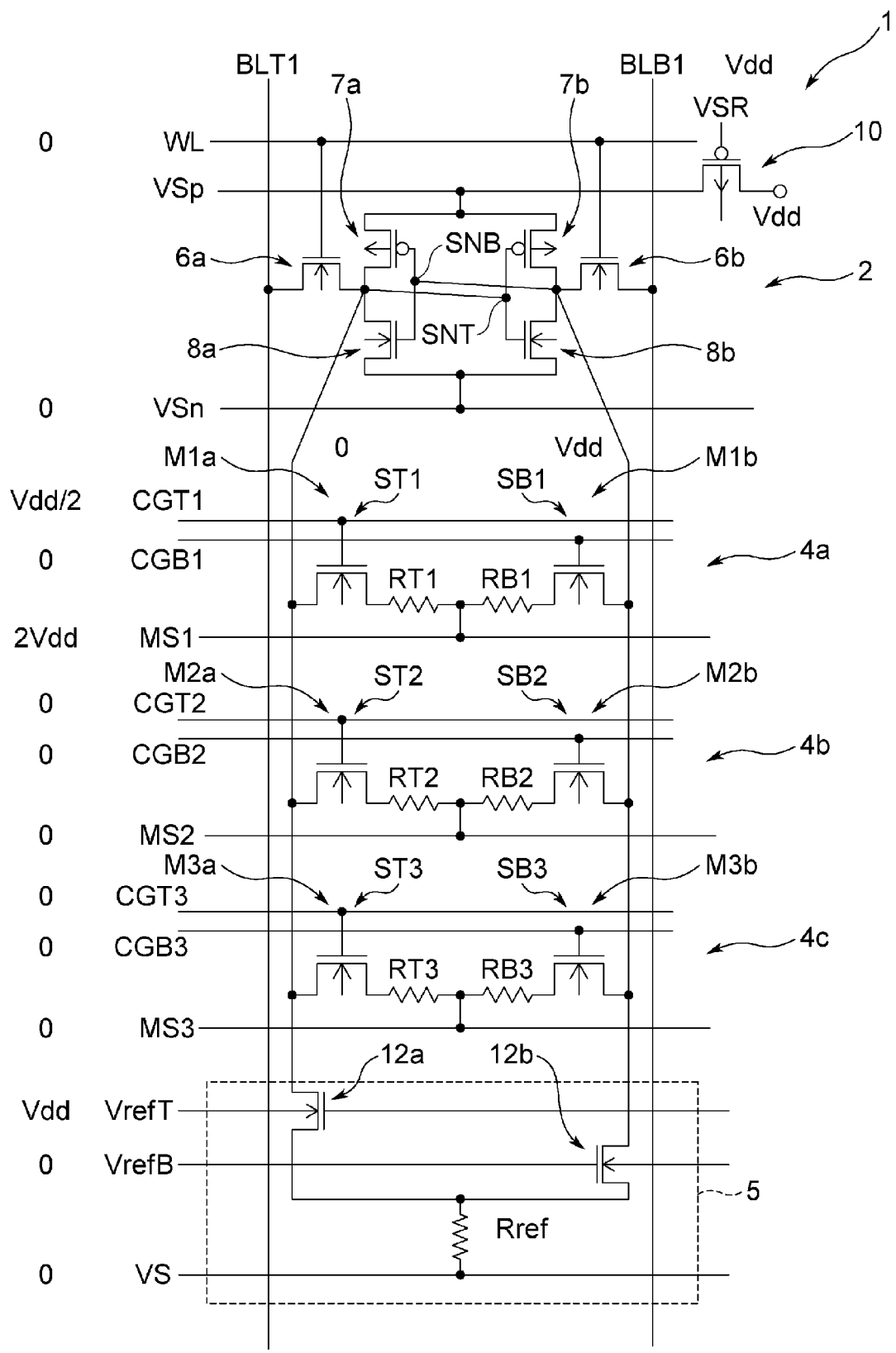
FIG. 8 is a schematic view illustrating non-volatile data erasing operation in a case where the non-volatile memory section functions as the independent-type cell.

(4) Non-Volatile Data Erasing Operation in a Non-Volatile Memory Section (4-1) An Example in Which a Non-Volatile Memory Section Functions as an Independent-Type Cell FIG. 8 shows a circuit diagram of the non-volatile SRAM memory cell 1 shown in FIG. 1 with an example of voltage values at corresponding sites in a case where the non-volatile memory section 4a in the first row functions as the independent-type cell and non-volatile data stored only in the first memory cell M1a of the non-volatile memory section 4a is erased, for example. In this case, 0 V is applied to the word line WL to turn off the first access transistor 6a and the second access transistor 6b of the SRAM 2. Thereby the electrical connection between the SRAM 2 and the first bit line BLT1 and the electrical connection between the SRAM 2 and the second bit line BLB1 are disconnected. The power control transistor 10 is turned off by applying a voltage Vdd to the gate of the power control transistor 10 through the power control gate line VSR. Thereby the application of the power supply voltage Vdd to the power line VSp is cut off, to stop the latch function of the SRAM 2.

At this time, the voltage Vdd is applied to the first node control gate line VrefT, and 0 V is applied to the second node control gate line VrefB. Thereby only the first node control transistor 12a connected to the first memory cell M1a from which the non-volatile data is to be erased is turned on. The second node control transistor 12b connected to the second memory cell M1b from which the non-volatile data is not to be erased is turned off. To the node control source line VS, 0 V is applied. The first storage node SNT is connected to the node control source line VS through the resistor element Rref and the first node control transistor 12a. Hence the potential of the first storage node SNT is 0 V.

In the first memory cell M1a of the non-volatile memory section 4a from which the non-volatile data is to be erased, the voltage Vdd/2 is applied to the first switch gate line CGT1. Thereby the first switch transistor ST1 connected to the first switch gate line CGT1 is turned on. In the second memory cell M1b of the non-volatile memory section 4a from which the non-volatile data is not to be erased and in the non-volatile memory sections 4b and 4c of other rows, 0 V is applied to the first switch gate lines CGT2 and CGT3 and the second switch gate lines CGB1, CGB2, and CGB3, to turn off the first switch transistors ST2 and ST3 and the second switch transistors SB1, SB2, and SB3.

In the non-volatile memory section 4a from which the non-volatile data is to be erased, the voltage 2×Vdd is applied to the memory source line MS1. In this embodiment, a voltage necessary for each of the first ReRAM RT1 and the second ReRAM RB1 to switch (change) from a high resistance state to a low resistance state is set to be higher than a voltage necessary to switch from the low resistance state to the high resistance state. For example, the high resistance state is switched to the low resistance state by the application of a voltage higher than Vdd and less than 2×Vdd.

In this embodiment, in a case where the first ReRAM RT1 is in the high resistance state, for example, and the voltage 2×Vdd is applied thereto through the memory source line MS1, the high resistance state is switched to the low resistance state when the voltage becomes higher than Vdd and less than 2×Vdd. Thereby the first memory cell M1a is in a state in which the non-volatile data has been erased (that is, the non-volatile data "1").

In FIG. 6, a voltage from the SRAM 2 side is defined as positive voltage and a voltage from the memory source line MS1 side is defined as a negative voltage, with reference to the first ReRAM RT1. Since the voltage Vdd/2 is applied to the gate of the first switch transistor ST1 when the first ReRAM RT1 switches from the high resistance state to the low resistance state at the voltage less than 2×Vdd, an upper limit of the current to flow into the ReRAM RT1 is controlled not to exceed a predetermined value. Thus, the first ReRAM RT1 is prevented from damage due to abrupt increase in current that may occur when the high resistance state switches to the low resistance state.

In the non-volatile memory section 4a, only the first switch transistor ST1 is turned on by the switch gate voltage. The non-volatile data stored in the second memory cell M1b is maintained while only the non-volatile data stored in the first memory cell M1a is erased by switching the first ReRAM RT1 from the high resistance state to the low resistance state, for example. Thus the non-volatile memory section 4a functions as the independent-type cell. In this embodiment, in a case where the first ReRAM RT1 is in the low resistance state, meaning that the non-volatile data has already been erased, the first ReRAM RT1 remains in the same low resistance state.

Of the non-volatile SRAM memory cells 1 disposed, for example, in a matrix in the non-volatile semiconductor memory device, even when one or more of the non-volatile SRAM memory cells access the SRAM 2 through turning on the first and second access transistors 6a and 6b to electrically connect the first and second bit lines BLT1 and BLB1 to the SRAM2, the non-volatile SRAM memory cells 1 in another row are capable of disconnecting the electrical connection between the SRAM 2 and the first and second bit lines BLT1 and BLB1. Thus, the non-volatile semiconductor memory device executes the non-volatile data erasing operation as the background operation.

Figure 9:
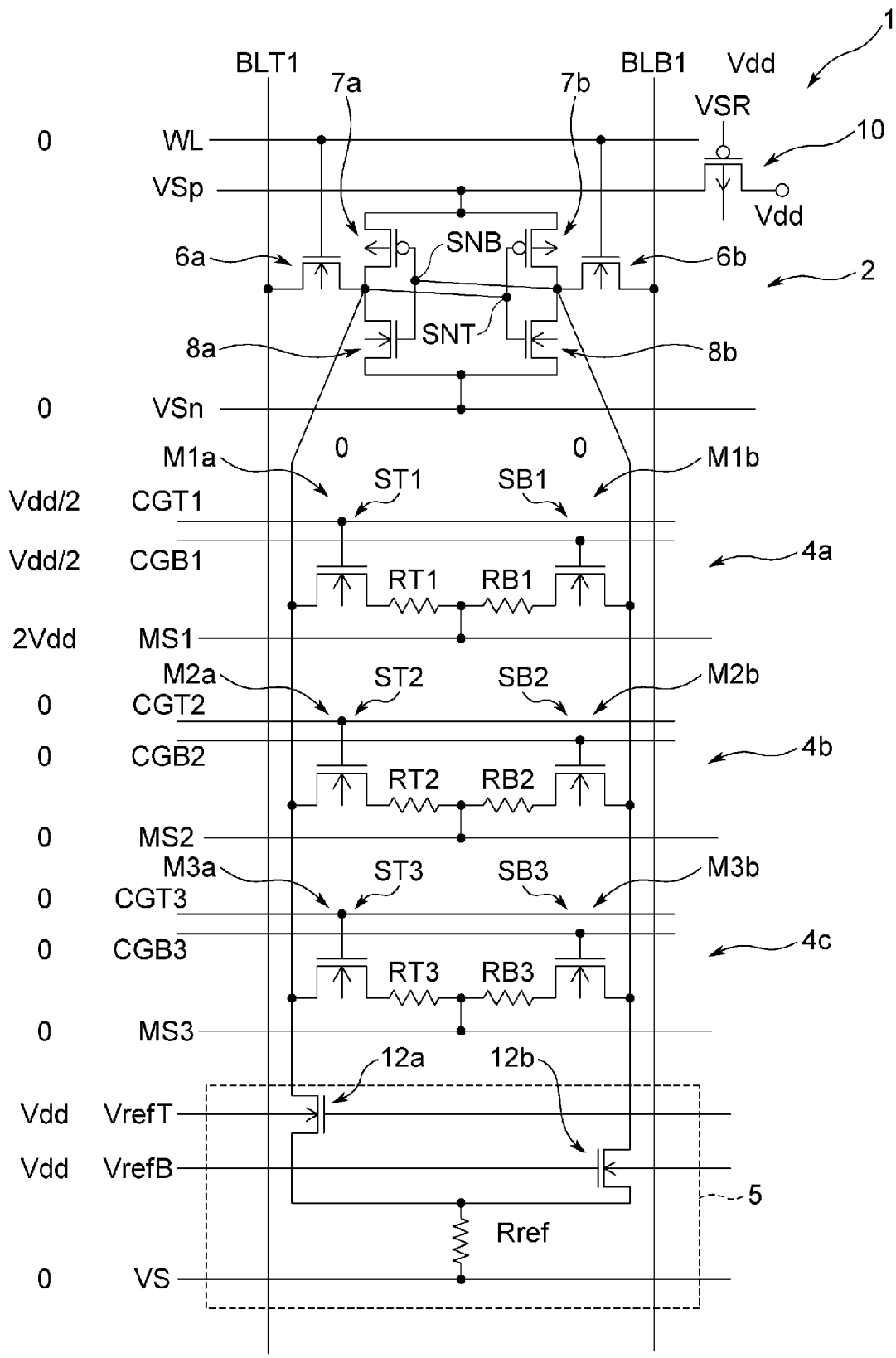
FIG. 9 is a schematic view illustrating the non-volatile data erasing operation in a case where the non-volatile memory section functions as the complementary-type cell.

(4-2) An Example in Which a Non-Volatile Memory Section Functions as a Complementary-Type Cell FIG. 9 is a circuit diagram of the non-volatile SRAM memory cell 1 shown in FIG. 1 with an example of voltage values at corresponding sites in a case where the non-volatile memory section 4a in the first row functions as the complementary memory cell and the complementary non-volatile data stored in the first and second memory cells M1a and M1b of the non-volatile memory section 4a is erased. In this case, in the non-volatile SRAM memory cell 1, the voltage Vdd is applied to the first and second node control gate lines VrefT and VrefB while the latch function of the SRAM 2 is stopped by the above-described procedure. Thereby the first and second node control transistors 12a and 12b connected to the first and second memory cells M1a and M1b from which the non-volatile data is to be erased are turned on.

At this time, 0 V is applied to the node control source line VS. The first storage node SNT is connected to the node control source line VS through the resistor element Rref and the first node control transistor 12a. The second storage node SNB is connected to the node control source line VS through the resistor element Rref and the second node control transistor 12b. Hence the potentials of the first and second storage nodes SNT and SNB are 0 V.

In the first and second memory cells M1a and M1b in the non-volatile memory section 4a from which the non-volatile data is to be erased, the first switch transistor ST1 connected to the first switch gate line CGT1 and the second switch transistor SB1 connected to the second switch gate line CGB1 are turned on by the application of the voltage Vdd/2 to each of the first switch gate line CGT1 and the second switch gate line CGB1. In the non-volatile memory sections 4b and 4c in other rows from which the non-volatile data is not to be erased, 0 V is applied to each of the first switch gate lines CGT2 and CGT3 and the second switch gate lines CGB2 and CGB3. Hence each of the first switch transistors ST2 and ST3 and the second switch transistors SB2 and SB3 is turned off.

In the non-volatile memory section 4a from which the non-volatile data is to be erased, the voltage 2×Vdd is applied to the memory source line MS1. In a case where one of the first and second ReRAM memories RT1 and RB1 is in the high resistance state when the voltage 2×Vdd is applied through the memory source line MS1, the high resistance state is switched to the low resistance state at the voltage higher than Vdd and less than 2×Vdd. Thereby the non-volatile data that has been stored in one of the first and second ReRAM memories RT1 and RB1 in the high resistance state is changed to an erased state (that is, the non-volatile data "1").

The non-volatile memory section 4a is capable of turning on both the first and second switch transistors ST1 and SB1 by the switch gate voltage. Thereby the non-volatile data stored in each of the first and second memory cells M1a and M1b is changed to the erased state.

Of the non-volatile SRAM memory cells 1 disposed, for example, in a matrix in the non-volatile semiconductor memory device 1, even when one or more of the non-volatile SRAM memory cells access the SRAM 2 through turning on the first and second access transistors 6a and 6b to electrically connect the first and second bit lines BLT1 and BLB1 to the SRAM 2, the non-volatile SRAM memory cells 1 in another row are capable of disconnecting the electrical connection between the SRAM 2 and the first and second bit lines BLT1 and BLB1. Thus, the non-volatile semiconductor memory device executes the non-volatile data erasing operation as the background operation.

(5) Operation and Effects

In the above-configured non-volatile SRAM memory cell 1, the non-volatile memory sections 4a, 4b, and 4c are connected in parallel to the SRAM 2. The SRAM 2 comprises the first storage node SNT and the second storage node SNB. The first storage node SNT is disposed between the first load transistor 7a and the first drive transistor 8a. One end of the first load transistor 7a is connected to one end of the first drive transistor 8a. The second storage node SNB is disposed between the second load transistor 7b and the second drive transistor 8b. One end of the second load transistor 7b is connected to one end of the second drive transistor 8b. The other end of the first load transistor 7a and the other end of the second load transistor 7b are connected to the power line VSp. The other end of the first drive transistor 8a and the other end of the second drive transistor 8b are connected to the reference voltage line VSn.

The SRAM 2 comprises the first access transistor 6a. One end of the first access transistor 6a is connected to the gate of the second load transistor 7b, the gate of the second drive transistor 8b, and the first storage node SNT. The other end of the first access transistor 6a is connected to the first bit line BLT1. The gate of the first access transistor 6a is connected to the word line WL. The SRAM 2 comprises the second access transistor 6b. One end of the second access transistor 6b is connected to the gate of the first load transistor 7a, the gate of the first drive transistor 8a, and the second storage node SNB. The other end of the second access transistor 6b is connected to the second bit line BLB1. The gate of the second access transistor 6b is connected to the word line WL.

The non-volatile memory sections 4a, 4b, and 4c have the same configuration. For example, the non-volatile memory section 4a in the first row comprises the first memory cell M1a and the second memory cell M1b. One end of the first switch transistor ST1 connected in series with the first ReRAM RT1 of the first memory cell M1a is connected to the first storage node SNT. One end of the second switch transistor SB1 connected in series with the second ReRAM RB1 of the second memory cell M1b is connected to the second storage node SNB.

In the non-volatile memory section 4a, the first switch gate line CGT1 is connected to the first switch transistor ST1. The second switch gate line CGB1 is connected to the second switch transistor SB1. Hence the first and second switch transistors ST1 and SB1 are turned on or off separately from each other.

In the non-volatile memory section 4a, the first and second switch transistors ST1 and SB1 are turned on concurrently. Thereby the first ReRAM RT1 is electrically connected to the first storage node SNT, and the second ReRAM RB1 is electrically connected to the second storage node SNB. The complementary SRAM data stored in the SRAM 2 is programmed into the first and second memory cells M1a and M1b. In the non-volatile memory section 4a, the first and second memory cells M1a and M1b function as the complementary-type cells. The complementary non-volatile data is written into the SRAM 2 or the complementary non-volatile data may be erased concurrently.

In the non-volatile memory section 4a, one of the first and second switch transistors ST1 and SB1 may be turned on to electrically connect only the first ReRAM RT1 to the first storage node SNT or to electrically connect only the ReRAM RB1 to the second storage node SNB. The non-volatile memory section 4a functions as the independent-type cell in accordance with the usage. Data may be programmed into one of the first and second memory cells M1a and M1b. Hence the memory capacity is increased. In the non-volatile memory section 4a, each of the first and second memory cell M1a and M1b may function as the independent-type cell. One of the non-volatile data may be written into the SRAM 2 or one of the non-volatile data may be erased from the SRAM 2.

The non-volatile SRAM memory cell functions as the complementary-type cell. In addition, in the case where the non-volatile SRAM memory cell 1 functions as the independent-type cell, only one of the first and second switch transistors ST1 and SB1 of, for example, the non-volatile memory section 4a is turned on. Thereby only one of the non-volatile data in the first memory cell M1a and the non-volatile data in the second memory cell M1b is written into the first or second storage node SNT or SNB connected to the first or second switch transistor ST1 or SB1 that has been turned on.

The non-volatile SRAM memory cell functions as the complementary-type cell. In addition, in the case where the non-volatile SRAM memory cell 1 functions as the independent-type cell, only one of the first and second switch transistors ST1 and SB1 of, for example, the non-volatile memory section 4a is turned on. Thereby one of the electrical connection between the first storage node SNT and the second ReRAM RB1 and the electrical connection between the second storage node SNB and the second ReRAM RB1 is established. One of the SRAM data in the first storage node SNT or the SRAM data in the second storage node SNB is programmed into the first memory cell M1a or the second memory cell M1b.

The non-volatile SRAM memory cell functions as the complementary-type cell. In addition, in the case where the non-volatile SRAM memory cell 1 functions as the independent-type cell, only one of the first and second switch transistors ST1 and SB1 of, for example, the non-volatile memory section 4a is turned on. Thereby the memory source line MS1 is electrically connected to one of the first storage node SNT and the second storage node SNB. The non-volatile data in the second memory cell M1b is erased by a potential difference between the voltage on the first or second storage node SNT or SNB and the voltage on the memory source line MS1.

Figure 10:
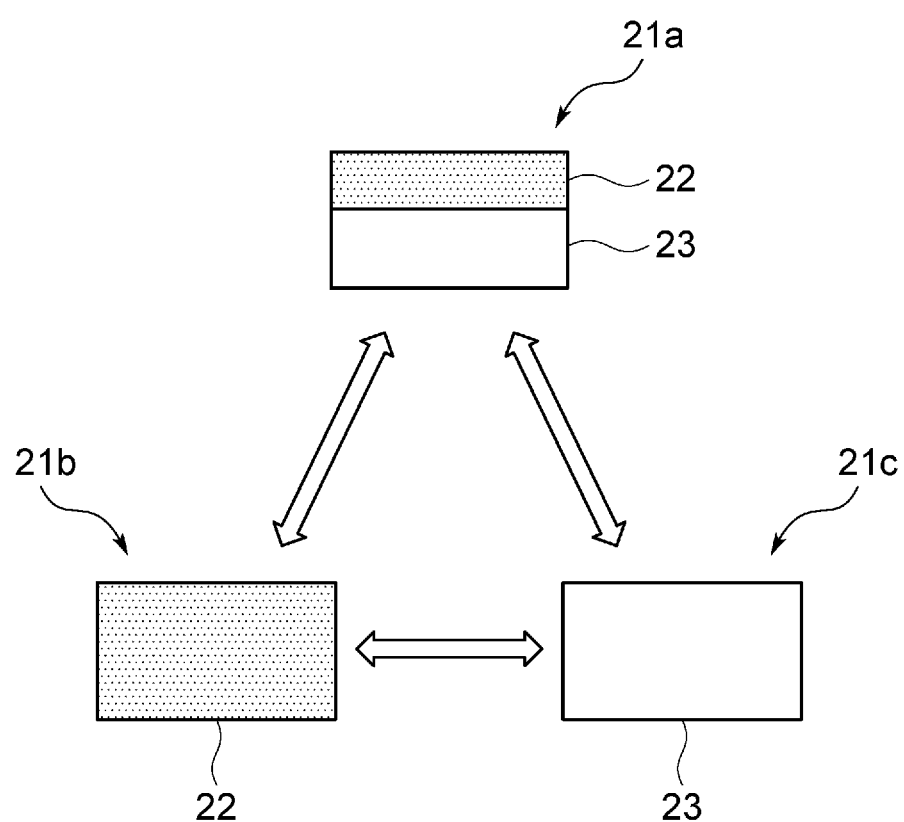
FIG. 10 is a schematic view illustrating an example in which a non-volatile SRAM memory cell is used as a complementary-type cell of 2 cells/1 bit (two cells per bit), an example in which a non-volatile SRAM memory cell is used as an independent-type cell of 1 cell/1 bit (one cell per bit), and an example in which the complementary-type cell coexist with the independent-type cell.

As illustrated in FIG. 10, in the non-volatile semiconductor memory device 21a, in which the non-volatile SRAM memory cells 1 (not shown) are disposed in a matrix of rows and columns, the non-volatile SRAM memory cells 1 located in one region and functioning as the independent-type cells may be grouped as an independent-type cell unit 22 and the non-volatile SRAM memory cells 1 located in a remaining region and functioning as the complementary-type cells may be grouped as a complementary-type cell unit 23. In the non-volatile semiconductor memory device 1, the complementary-type cell unit 23, in which high speed operation and high reliability are prioritized, coexist with the independent-type cell unit 22, in which increase in the memory capacity is prioritized. Optimum configuration of the two units is achieved in accordance with the usage.

The non-volatile semiconductor memory device 21a may be used in a form of a non-volatile semiconductor memory device 21b, in which all of the non-volatile SRAM memory cells 1 disposed in a matrix of rows and columns function as the independent-type cells constituting the independent-type cell unit 22. In accordance with the usage, the non-volatile semiconductor memory device 21a may be used in a form of a non-volatile semiconductor memory device 21c, in which all of the non-volatile SRAM memory cells 1 function as the complementary-type cells constituting the complementary-type cell unit 23.

In the non-volatile SRAM memory cell 1 of the present invention, the node controller 5 is connected to the SRAM 2 and the non-volatile memory sections 4a, 4b, and 4c. The first storage node SNT or the second storage node SNB is selectively connected to the node control source line VS by a switching operation performed by the node controller 5.

To write the non-volatile data stored in one of the first and second memory cells M1a and M1b of, for example, the non-volatile memory section 4a into the SRAM 2 in the non-volatile SRAM memory cell 1, the first access transistor 6a is turned off to disconnect the electrical connection between the SRAM 2 and the first bit line BLT1 and the second access transistor 6b is turned off to disconnect the electrical connection between the SRAM 2 and the second bit line BLB1.

In the non-volatile SRAM memory cell 1 in this state, the potential of the first or second storage node SNT or SNB into which the non-volatile data is to be written becomes high or low, in accordance with the magnitude relationship between the memory current Imem and the reference current Iref. The memory current Imem flows from the first or second storage node SNT or SNB, into which the non-volatile data is to be written, to the first or second ReRAM RT1 or RB1 which writes the non-volatile data into the SRAM 2. The reference current Iref flows from the first or second storage node SNT or SNB, into which the non-volatile data is not to be written, to the node controller 5.

To be more specific, in a case where the first or second ReRAM RT1 or RB1 which writes the non-volatile data into the SRAM 2 is in a low resistance state (for example, in a state in which the non-volatile data "1" is stored), the memory current Imem is higher than the reference current Iref. The potential of the first or second storage node SNT or SNB into which the non-volatile data is to be written becomes lower than the potential of the second or first storage node SNB or SNT into which the non-volatile data is not to be written.

In a case where the first or second ReRAM RT1 or RB1 which writes the non-volatile data into the SRAM 2 is in a high resistance state (for example, in a state in which the non-volatile data "0" is stored), the memory current Imem is lower than the reference current Iref. The potential of the first or second storage node SNT or SNB into which the non-volatile data is to be written becomes higher than the potential of the second or first storage node SNB or SNT into which the non-volatile data is not to be written.

Even when one non-volatile SRAM memory cell 1, which shares the first bit line BLT1 and the second bit line BLB1 with another non-volatile SRAM memory cell 1, accesses the SRAM 2 through the first bit line BLT1 and the second bit line BLB1, the another non-volatile SRAM memory cell 1 is capable of executing the SRAM writing operation to write the non-volatile data, stored in the first memory cell M1a or the second memory cell M1b, into the SRAM 2 with the first bit line BLT1 and the second bit line BLB1 disconnected. Thus, the SRAM writing operation is executed in the background.

The non-volatile semiconductor memory device 21, in which the non-volatile SRAM memory cells 1 are disposed in a matrix of rows and columns, is capable of performing verification operation. The verification operation is to verify whether the SRAM data in the SRAM 2 has been programmed into the first memory cell (M1a, M2a, M3a) and/or the second memory cell (M1b, M2b, M3b) in the non-volatile memory section (4a, 4b, 4c) in the non-volatile SRAM memory cell 1. In this case, the non-volatile SRAM memory cell 1 performs the SRAM writing operation in the background in advance according to the above-described sections (2-1) An example in which a non-volatile memory section functions as an independent-type cell and (2-2) An example in which a non-volatile memory section functions as a complementary-type cell in the (2) SRAM writing operation. For example, the SRAM writing operation is to write the non-volatile data, stored in the first memory cell M1a and/or the second memory cell M1b of the non-volatile memory section 4a, into the SRAM 2. Thereafter, the potential of the first storage node SNT and/or the second storage node SNB of the SRAM 2 in the non-volatile SRAM memory cell 1 is read out through the first bit line BLT1 and the second bit line BLB1. Based on the result of the readout, whether the non-volatile data "1" or "0" has been programmed into the non-volatile memory section 4a is verified.

During the access through the first bit line BLT1 and the second bit line BLB1 to the SRAM 2 performed by the non-volatile SRAM memory cell 1 in another row, the non-volatile SRAM memory cell 1 in which the verification operation is to be performed is capable of executing the SRAM writing operation in the background in advance. The SRAM writing operation is performed just before the verification operation, which uses the first bit line BLT1 and the second bit line BLB1 to read out the SRAM data from the SRAM 2. The SRAM data in the SRAM 2 is to be read out as the result of the verification.

To perform the verification operation in the non-volatile SRAM memory cell 1, the result of the verification already written into the first or second storage node SNT or SNB is read out, after the end of the access to the SRAM 2 through the first bit line BLT1 and the second bit line BLB1 by the non-volatile SRAM memory cell 1 in another row. Thus the result of the verification is obtained quickly.

Figure 11:
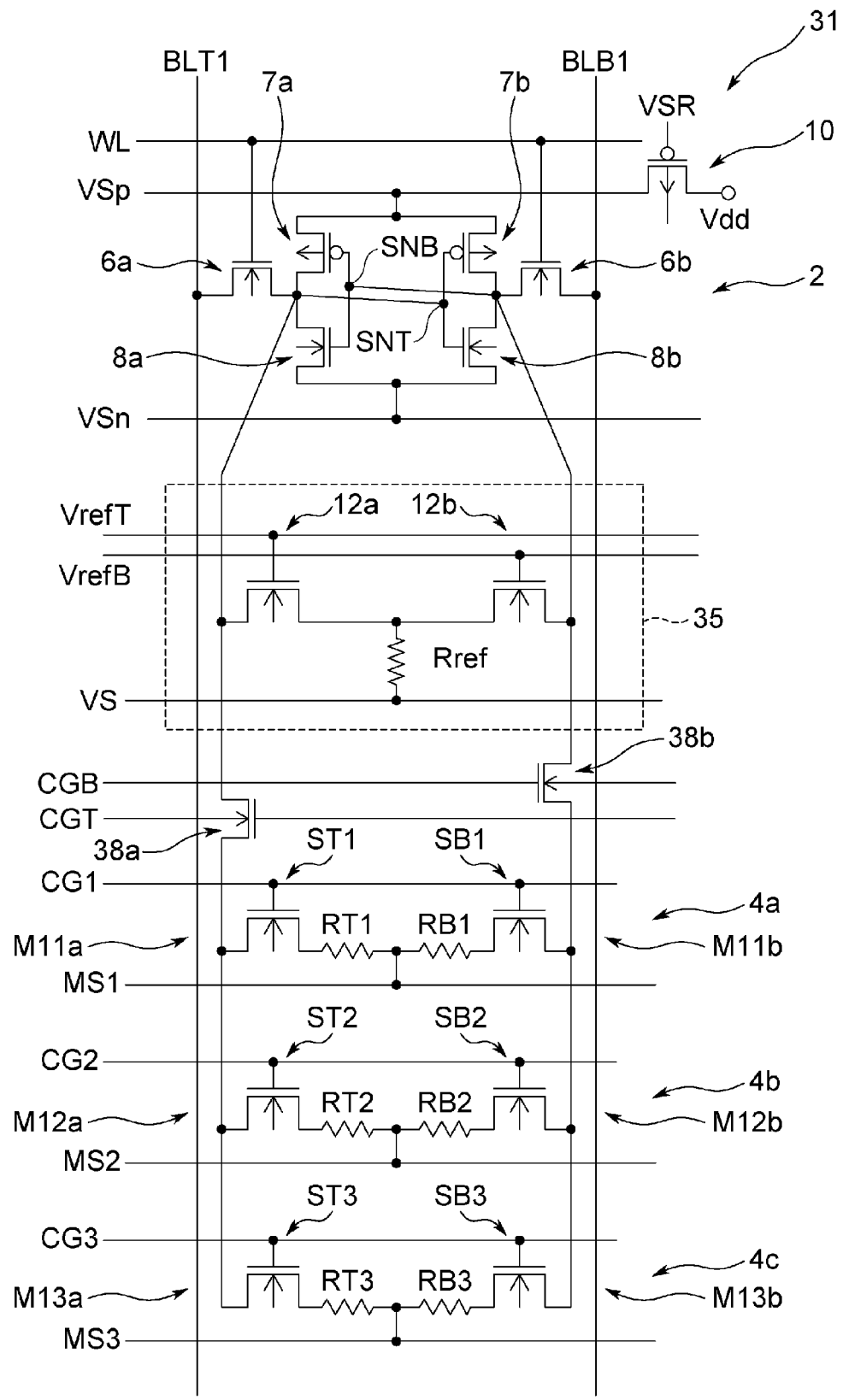
FIG. 11 is a schematic view illustrating circuit configuration of a non-volatile SRMAM memory cell comprising a first common switch transistor and a second common switch transistor.

(6) An Example in Which a First Common Switch Transistor and a Second Common Switch Transistor are Provided In FIG. 11, in which parts corresponding to those in FIG. 1 are denoted by the same numerals, a numeral 31 denotes a non-volatile SRAM memory cell of another embodiment. The non-volatile SRAM memory cell 31 is different from the non-volatile SRAM memory cell 1 shown in FIG. 1 in the following points: the non-volatile SRAM memory cell 31 comprises a first common switch transistor 38a and a second common switch transistor 38b; a node controller 35 is disposed between the SRAM 2 and the first and second common switch transistors 38a and 38b; and the first switch transistor (ST1, ST2, ST3) and the second switch transistor (SB1, SB2, SB3) share one switch gate line (CG1, CG2, CG3) in the non-volatile memory section (4a, 4b, 4c).

Of the switch gate lines CG1, CG2, and CG3 in the non-volatile SRAM memory cell 31, the voltage Vdd is applied to the switch gate line CG1 in the first row, for example, and 0 V is applied to the remaining switch gate lines CG2 and CG3. Thereby the first switch transistor ST1 and the second switch transistor SB1 of the non-volatile memory section 4a are turned on concurrently.

The voltage Vdd is applied to a first common switch gate line CGT connected to a gate of the first common switch transistor 38a, and 0 V is applied a second common switch gate line CGB connected to a gate of the second common switch transistor 38b. Thereby only the first common switch transistor 38a is turned on while the second common switch transistor 38b is turned off.

Hence, in the non-volatile SRAM memory cell 31, only the first ReRAM RT1 in a first memory cell M11a of the non-volatile memory section 4a is electrically connected to the first storage node SNT, for example, while the second ReRAM RB1 is electrically disconnected from the second storage node SNB. Thus, the non-volatile SRAM memory cell 31 allows the non-volatile memory section 4a to function as the independent-type cell, in a manner similar to the non-volatile SRAM memory cell 1 of the above embodiment.

The voltage Vdd may be applied to each of the first common switch gate line CGT, which is connected to the gate of the first common switch transistor 38a, and the second common switch gate line CGB, which is connected to the gate of the second common switch transistor 38b. Thereby the first common switch transistor 38a and the second common switch transistor 38b are turned on concurrently.

The non-volatile SRAM memory cell 31 is capable of electrically connecting the first ReRAM RT1 of the first memory cell M11a in the non-volatile memory section 4a to the first storage node SNT. The non-volatile SRAM memory cell 31 is capable of electrically connecting the second ReRAM RB1, which pairs with the first ReRAM RT1, to the second storage node SNB. Thus, the non-volatile memory section 4a functions as the complementary-type cell, similar to the non-volatile SRAM memory cell 1 according to the above embodiments.

The SRAM writing operation, the memory programming operation, and the non-volatile data erasing operation according to this embodiment are executed using the principles similar to those of the non-volatile SRAM memory cell 1 and hence the descriptions are omitted.

The non-volatile memory section 4a concurrently turns on the first switch transistor ST1 and the second switch transistor SB1. Thereby the first ReRAM RT1 is electrically connected to the first storage node SNT, and the second ReRAM RB1 is electrically connected to the second storage node SNB. Hence the complementary SRAM data stored in the SRAM 2 is programmed into the non-volatile memory section 4a. Similarly, the non-volatile memory section 4a allows the first memory cell M11a and the second memory cell M11b to function as the complementary-type cells. The complementary non-volatile data may be written into the SRAM 2. The complementary non-volatile data may be erased concurrently.

In the non-volatile memory section 4a, one of the first switch transistor ST1 and the second switch transistor SB1 is turned on. Thereby only the first ReRAM RT1 may be electrically connected to the first storage node SNT, or only the second ReRAM RB1 may be electrically connected to the second storage node SNB. Thus the non-volatile memory section 4a is used as the independent-type cell in accordance with the usage. The non-volatile memory section 4a is capable of storing data separately. Thus, the memory capacity is increased. Similarly, in the non-volatile memory section 4a, the first memory cell M11a and the second memory cell M11b functions as the independent-type cells. Hence one of non-volatile data may be written into the SRAM 2. One of the non-volatile data may be erased.

Similar to the above embodiments, even when one of the non-volatile SRAM memory cells 31, which share the first bit line BLT1 and the second bit line BLB1 with another non-volatile SRAM memory cell 31, accesses the SRAM 2 through the first bit line BLT1 and the second bit line BLB1, the another non-volatile SRAM memory cell 31 is capable of disconnecting the electrical connection between the SRAM 2 and the first and second bit lines BLT1 and BLB1. Thus, the non-volatile SRAM memory cells 31 execute the SRAM writing operation, the memory programming operation, or the non-volatile data erasing operation as the background operation.

(7) Non-Volatile SRAM Memory Cells of Other Embodiments

In the above embodiments, the first ReRAMs RT1, RT2, and RT3 and the second ReRAMs RB1, RB2, and RB3, each of which is capable of storing the non-volatile data ("1", "0") in accordance with a change in a resistance value, are used as the first and second memories. The present invention is not limited to this. Various types of first and second memories, for example, floating gate memories or discrete trap memories, may be used as long as each of the first and second memories is capable of storing the non-volatile data ("1", "0").

Figure 12:
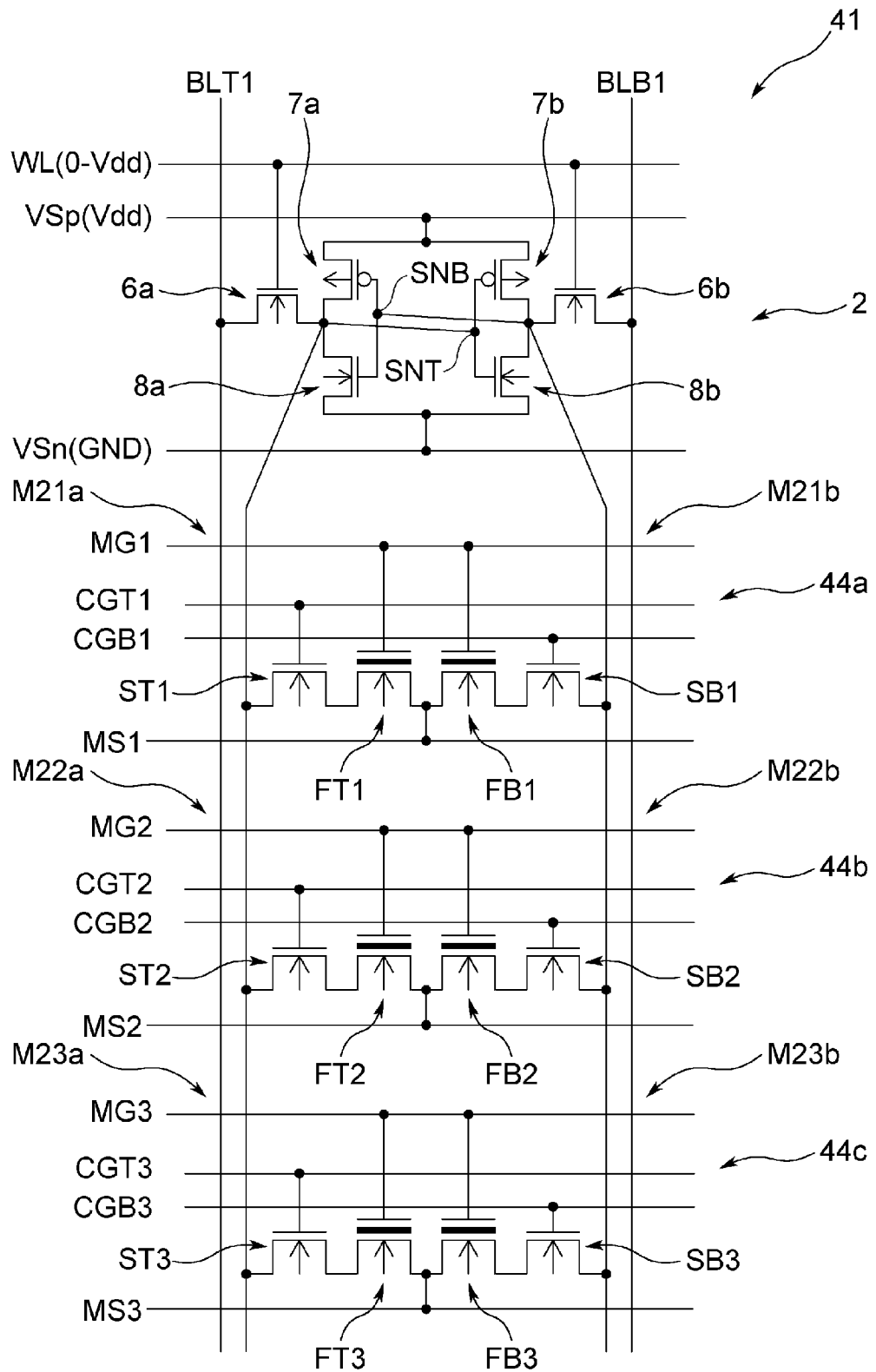
FIG. 12 is a schematic view illustrating circuit configuration of a non-volatile SRAM memory cell of another embodiment.

For example, in FIG. 12, in which parts corresponding to those in FIG. 1 are denoted by the same numerals, a numeral 41 denotes a non-volatile SRAM memory cell of another embodiment. First floating gates FT1, FT2, and FT3 are provided as the first memory. Second floating gates FB1, FB2, and FB3 are provided as the second memory. The first switch gate line (CGT1, CGT2, CGT3) is connected to the gate of the first switch transistor (ST1, ST2, ST3) in the non-volatile memory section (44a, 44b, 44c). The second switch gate line (CGB1, CGB2, CGB3) is connected to the gate of the second switch transistor (SB1, SB2, SB3).

With the use of the first switch gate line (CGT1, CGT2, CGT3) and the second switch gate line (CGB1, CGB2, CGB3), the non-volatile memory section (44a, 44b, 44c) separately applies different switch gate voltages to the first switch transistor (ST1, ST2, ST3) and the second switch transistor (SB1, SB2, SB3). The first switch transistor (ST1, ST2, ST3) and the second switch transistor (SB1, SB2, SB3) are turned on or off separately from each other by the voltage difference between the gate and one end.

Similar to the above embodiments, for example, the first switch transistor ST1 and the second switch transistor SB1 in the non-volatile memory section 44a are turned on concurrently. Thereby the first floating gate FT1 is electrically connected to the first storage node SNT, and the second floating gate FB1 is electrically connected to the second storage node SNB. Thereby the complementary SRAM data stored in the SRAM 2 is concurrently programmed into the non-volatile memory section 44a.

The non-volatile memory section 44a is capable of turning on only one of the first switch transistor ST1 and the second switch transistor SB1. The non-volatile memory section 44a may electrically connect only the first floating gate FT1 to the first storage node SNT, or may electrically connect only the second floating gate FB1 to the second storage node SNB. Thus, the non-volatile memory section 44a may function as the independent-type cell in accordance with the usage. Data may be programmed separately into the non-volatile memory section 44a. Thus the memory capacity is increased.

Similar to the above embodiments, even when one non-volatile SRAM memory cell 41, which shares the first bit line BLT1 and the second bit line BLB1 with another non-volatile SRAM memory cell 41, accesses the SRAM 2 through the first bit line BLT1 and the second bit line BLB1, the another non-volatile SRAM memory cell 41 is capable of electrically disconnecting the first and second bit lines BLT1 and BLB1 from the SRAM 2. Hence the SRAM writing operation, the memory programming operation, or the non-volatile data erasing operation is executed in the background.

(8) Other Embodiments

The first ReRAMs RT1, RT2, and RT3 and the second ReRAMs RB1, RB2, and RB3 of a bipolar type are used as the above-described first and second ReRAMs. The present invention is not limited to them. First and second ReRAMs of unipolar type(s) may be used.

In (2-1) An example in which a non-volatile memory section functions as an independent-type cell in (2) SRAM writing operation, the node controller 5 is provided and the reference current Iref is supplied to the node controller 5. The present invention is not limited to this. The node controller 5 may not be provided. One of the first and second access transistors 6a or 6b may be turned on without the use of the node controller 5. Thereby the reference current Iref is supplied to one of the first and second bit lines BLT1 and BLB1. Since the first and second bit lines BLT1 and BLB1 are used, the SRAM writing operation cannot be executed as the background operation. However, the non-volatile memory section functions as the independent-type cell, similar to the above-described (2-1) An example in which a non-volatile memory section functions as an independent-type cell.

In the above embodiments, a fixed resistor Rref having a predetermined resistance value is used. The present invention is not limited to this. A variable resistor element may be used. The resistance that occurs in the first node control transistor 12a and/or the second node control transistor 12b may be regarded as a resistor element.

In the above embodiments, the SRAM 2 comprising the six transistors is used. The present invention is not limited to this. For example, the SRAM may have four transistors and two resistor elements, for example. Various types of SRAM having the first and second storage nodes and having the latch function may be used.

The SRAM comprising the four transistors and the two resistor elements have the resistor elements instead of the first load transistor 7a and the second load transistor 7b in the SRAM shown in FIG. 1. The SRAM has the first and second storage nodes and has a latch function, similar to the SRAM 2.

REFERENCE SIGNS LIST 1, 31, 41 non-volatile SRAM memory cell
21, 21a, 21b, 21c non-volatile semiconductor memory device
2 SRAM
4a, 4c, 4b, 44a, 44b, 44c non-volatile memory section
5 node controller
M1a, M2a, M3a first memory cell
M1b, M2b, M3b second memory cell
ST1, ST2, ST3 first switch transistor
SB1, SB2, SB3 second switch transistor
RT1, RT2, RT3 first ReRAM (first memory)
RB1, RB2, RB3 second ReRAM (second memory)
BLT1 first bit line
BLB1 second bit line
6a first access transistor 6b second access transistor
7a first load transistor
7b second load transistor
8a first drive transistor
8b second drive transistor
FT1, FT2, FT3 first floating gate (first memory)
FB1, FB2, FB3 second floating gate (second memory)

The invention claimed is:

1. A non-volatile SRAM memory cell comprising:
an SRAM comprising a first storage node and a second storage node complementary to the first storage node;
a plurality of non-volatile memory sections connected in parallel to the SRAM; and
a node controller connected to the SRAM and to the non-volatile memory sections,
each non-volatile memory section comprising:
  a first memory cell configured to electrically connect a first memory to the first storage node through a first switch transistor; and
  a second memory cell configured to electrically connect a second memory to the second storage node through a second switch transistor,
  wherein the first switch transistor and the second switch transistor turn on or off separately from each other,
the node controller comprising:
  a first node control transistor connected to the first storage node and to one end of the first switch transistor of each of the non-volatile memory sections;
  a second node control transistor connected to the second storage node and to one end of the second switch transistor of each of the non-volatile memory sections;
  a node control source line; and
  a resistor element disposed between the first node control transistor and the node control source line and between the second node control transistor and the node control source line, the resistor element allowing a current higher than or equal to a specified value to flow,
  wherein a first node control gate line is connected to the first node control transistor, and a second node control gate line is connected to the second node control transistor, and the first node control transistor and the second node control transistor are turned on or off separately from each other,
  wherein the node controller performs a switching operation to selectively connect the first storage node and/or the second storage node to the node control source line.

2. The non-volatile SRAM memory cell according to claim 1, wherein
a first switch gate line is connected to the first switch transistor, and
a second switch gate line is connected to the second switch transistor, and
the first switch transistor turns on or off in accordance with a voltage applied to a gate of the first switch transistor through the first switch gate line, and
the second switch transistor turns on or off in accordance with a voltage applied to a gate of the second switch transistor through the second switch gate line.

3. A non-volatile SRAM memory cell comprising:
an SRAM comprising a first storage node and a second storage node complementary to the first storage node;
a plurality of non-volatile memory sections connected in parallel to the SRAM; and
a node controller connected to the SRAM and to the non-volatile memory sections,
each non-volatile memory section comprising:
  a first memory cell configured to electrically connect a first memory to the first storage node through a first switch transistor;
  a second memory cell configured to electrically connect a second memory to the second storage node through a second switch transistor,
  a first common switch transistor disposed between the first switch transistor and the first storage node, the first common switch transistor being connected in series to the first switch transistor; and
  a second common switch transistor disposed between the second switch transistor and the second storage node, the second common switch transistor being connected in series to the second switch transistor,
  wherein the first common switch transistor and the second common switch transistor turn on or off separately from each other,
the node controller comprising:
  a first node control transistor connected to the first storage node;
  a second node control transistor connected to the second storage node;
  a node control source line; and
  a resistor element disposed between the first node control transistor and the node control source line and between the second node control transistor and the node control source line, the resistor element allowing a current higher than or equal to a specified value to flow,
  wherein a first node control gate line is connected to the first node control transistor, and a second node control gate line is connected to the second node control transistor, and the first node control transistor and the second node control transistor are turned on or off separately from each other,
  wherein the node controller performs a switching operation to selectively connect the first storage node and/or the second storage node to the node control source line.

4. The non-volatile SRAM memory cell according to claim 1, wherein one of the first switch transistor and the second switch transistor of a selected one of the non-volatile memory sections is turned on, to write one of non-volatile data of the first memory cell and non-volatile data of the second memory cell into the first or second storage node connected to the first or second switch transistor that is turned on.

5. The non-volatile SRAM memory cell according to claim 1, wherein one of the first switch transistor and the second switch transistor of a selected one of the non-volatile memory sections is turned on, to establish electrical connection between the first storage node and the first memory or between the second storage node and the second memory, and SRAM data stored in one of the first storage node and the second storage node is programmed into the first memory cell or the second memory cell.

6. The non-volatile SRAM memory cell according to claim 1, wherein one end of the first memory is connected to the first switch transistor and the other end of the first memory is connected to a memory source line, and one end of the second memory is connected to the second switch transistor and the other end of the second memory is connected to the memory source line, and one of the first switch transistor and the second switch transistor is turned on to connect the memory source line to one of the first storage node and the second storage node, and non-volatile data in the first memory cell or non-volatile data in the second memory cell is erased by a potential difference between a voltage on the first or second storage node connected to the memory source line and a voltage on the memory source line.

7. A non-volatile SRAM memory cell comprising:
an SRAM comprising a first storage node and a second storage node complementary to the first storage node;
a plurality of non-volatile memory sections connected in parallel to the SRAM; and
a node controller connected to the SRAM and to the non-volatile memory sections,
each non-volatile memory section comprising:
    a first memory cell configured to electrically connect a first memory to the first storage node through a first switch transistor; and
    a second memory cell configured to electrically connect a second memory to the second storage node through a second switch transistor,
    wherein the first switch transistor and the second switch transistor turn on or off separately from each other,
wherein one of the first switch transistor and the second switch transistor of a selected one of the non-volatile memory sections is turned on, to write one of non-volatile data of the first memory cell and non-volatile data of the second memory cell into the first or second storage node connected to the first or second switch transistor that is turned on, and
in a case where the non-volatile data of one of the first memory cell and the second memory cell is written into the SRAM, a first access transistor provided in the SRAM is turned off to disconnect electrical connection between the SRAM and a first bit line and a second access transistor provided in the SRAM is turned off to disconnect electrical connection between the SRAM and a second bit line, and
in a case where a memory current is higher than a reference current, a potential of the first or second storage node into which the non-volatile data is to be written is lower than a potential of the second or the first storage node to which the non-volatile data is not to be written, and
in a case where the memory current is lower than the reference current, the potential of the first or second storage node into which the non-volatile data is to be written is higher than the potential of the second or first storage node to which the non-volatile data is not to be written,
the memory current flowing to the first or second memory that writes the non-volatile data into the SRAM, from the first or second storage node into which the non-volatile data is to be written, the reference current flowing to the node controller from the second or first storage node into which the non-volatile data is not to be written.

8. A non-volatile SRAM memory cell comprising:
an SRAM comprising a first storage node and a second storage node complementary to the first storage node;
a plurality of non-volatile memory sections connected in parallel to the SRAM; and
a node controller connected to the SRAM and to the non-volatile memory sections,
each non-volatile memory section comprising:
    a first memory cell configured to electrically connect a first memory to the first storage node through a first switch transistor; and
    a second memory cell configured to electrically connect a second memory to the second storage node through a second switch transistor,
    wherein the first switch transistor and the second switch transistor turn on or off separately from each other,
wherein the node controller performs a switching operation to selectively connect the first storage node and/or the second storage node to a node control source line, and
in a state that the electrical connection between the SRAM and the first bit line is disconnected by turning off the first access transistor provided in the SRAM and the electrical connection between the SRAM and the second bit line is disconnected by turning off the second access transistor provided in the SRAM, application of power supply voltage to the first and second storage nodes is stopped and the first and second storage nodes are connected to the node control source line through the node controller, to lower the potentials of the first storage node and the second storage node to potentials of an initial state.

9. A non-volatile semiconductor memory device comprising:
non-volatile SRAM memory cells according to claim 1, the non-volatile SRAM memory cells disposed in a matrix of rows and columns, the non-volatile SRAM memory cells disposed on one side share a first bit line and a second bit line.

* * * * *